(12) United States Patent
Beak et al.

(10) Patent No.: US 10,672,339 B2
(45) Date of Patent: Jun. 2, 2020

(54) ORGANIC LIGHT-EMITTING DISPLAY DEVICE

(71) Applicant: LG Display Co., Ltd., Seoul (KR)

(72) Inventors: Jung-Sun Beak, Paju-si (KR);
Jeong-Oh Kim, Goyang-si (KR);
Jong-Won Lee, Seoul (KR); Dong-Kyu Lee, Gunsan-si (KR)

(73) Assignee: LG Display Co., Ltd., Seoul (KR)

( * ) Notice: Subject to any disclaimer, the term of this patent is extended or adjusted under 35 U.S.C. 154(b) by 179 days.

(21) Appl. No.: 15/837,286

(22) Filed: Dec. 11, 2017

(65) Prior Publication Data

US 2018/0166015 A1    Jun. 14, 2018

(30) Foreign Application Priority Data

Dec. 14, 2016  (KR) .................. 10-2016-0170520

(51) Int. Cl.
| | |
|---|---|
| *G09G 3/3258* | (2016.01) |
| *H01L 27/32* | (2006.01) |
| *H01L 51/52* | (2006.01) |
| *H01L 27/12* | (2006.01) |

(52) U.S. Cl.
CPC ....... *G09G 3/3258* (2013.01); *H01L 27/1218* (2013.01); *H01L 27/1288* (2013.01); *H01L 27/3262* (2013.01); *H01L 27/3265* (2013.01); *H01L 27/3276* (2013.01); *H01L 51/5203* (2013.01); *H01L 27/3246* (2013.01)

(58) Field of Classification Search
CPC .............. G09G 3/3258; H01L 27/1218; H01L 27/1288; H01L 27/32; H01L 27/3244; H01L 27/3246; H01L 27/3262; H01L 27/3265; H01L 27/3276; H01L 51/5203
See application file for complete search history.

(56) References Cited

U.S. PATENT DOCUMENTS

| | | | |
|---|---|---|---|
| 8,633,490 B2* | 1/2014 | Park ................... | H01L 27/1225 257/59 |
| 2013/0032805 A1* | 2/2013 | Kim .................... | H01L 27/3258 257/59 |
| 2013/0037812 A1* | 2/2013 | Park ................... | H01L 27/3248 257/59 |
| 2015/0097172 A1* | 4/2015 | Han .................... | H01L 27/3265 257/40 |

(Continued)

*Primary Examiner* — Allan R Wilson
(74) *Attorney, Agent, or Firm* — Morgan, Lewis & Bockius LLP

(57) ABSTRACT

Disclosed is an organic light-emitting display device capable of realizing a high resolution. The organic light-emitting display device includes a storage capacitor disposed on a substrate, which overlaps at least one transistor, with at least one buffer layer interposed therebetween, the at least one buffer layer disposed on the storage capacitor, and which includes a lower storage electrode and an upper storage electrode overlapping the lower storage electrode, with a storage buffer layer interposed therebetween, and a light-emitting diode connected to the transistor. One of the lower storage electrode and the upper storage electrode is formed to have the same line width and the same shape as the storage buffer layer, thereby ensuring a sufficient process margin and consequently realizing a high resolution and improving production yield.

20 Claims, 20 Drawing Sheets

(56) References Cited

U.S. PATENT DOCUMENTS

| | | | |
|---|---|---|---|
| 2015/0206929 A1* | 7/2015 | Sato | H01L 27/32 |
| | | | 257/40 |
| 2016/0204172 A1* | 7/2016 | Park | H01L 27/3248 |
| | | | 257/40 |
| 2017/0186831 A1* | 6/2017 | Nam | H01L 27/3272 |
| 2017/0317155 A1* | 11/2017 | Oh | H01L 27/3246 |
| 2018/0122886 A1* | 5/2018 | Kim | H01L 27/12 |

\* cited by examiner

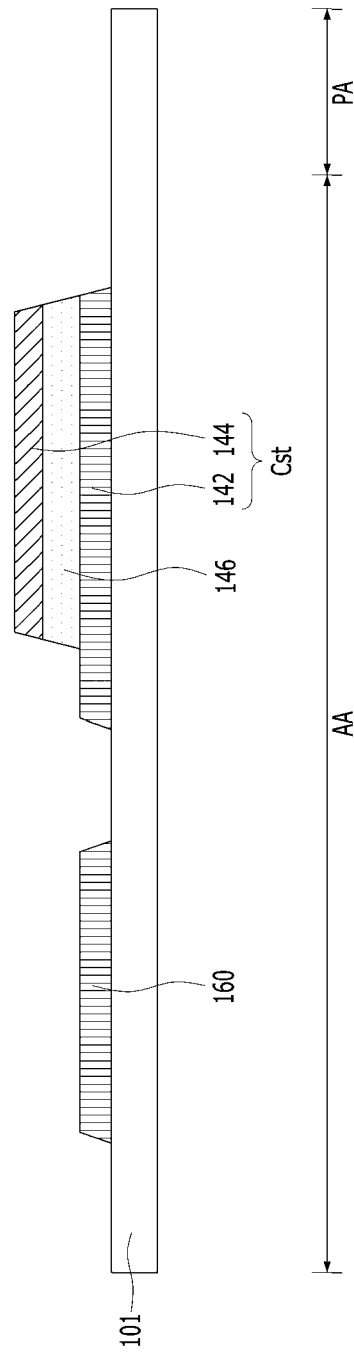
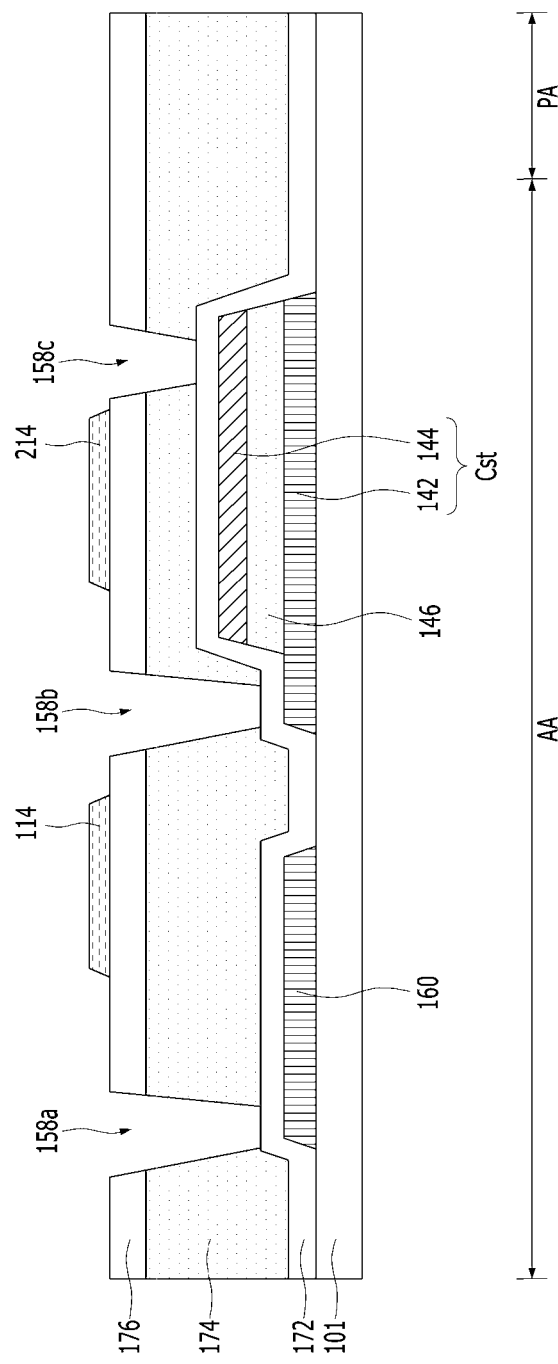

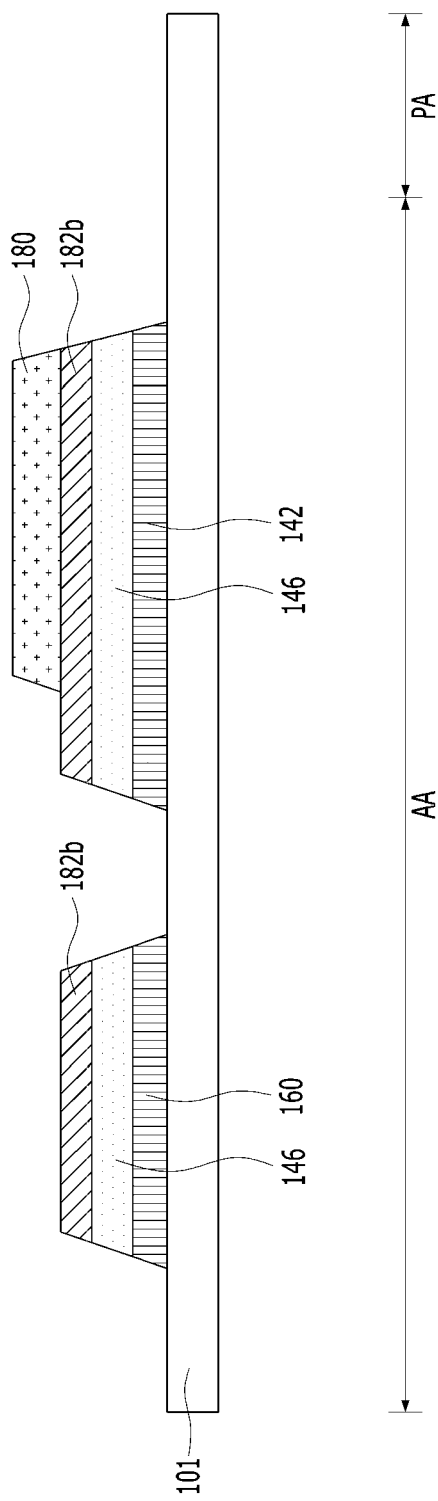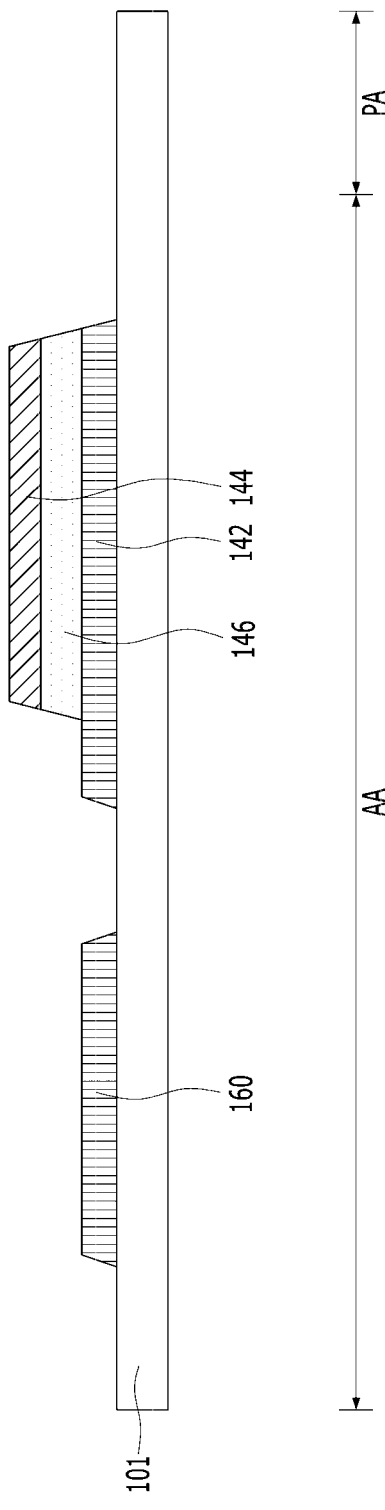

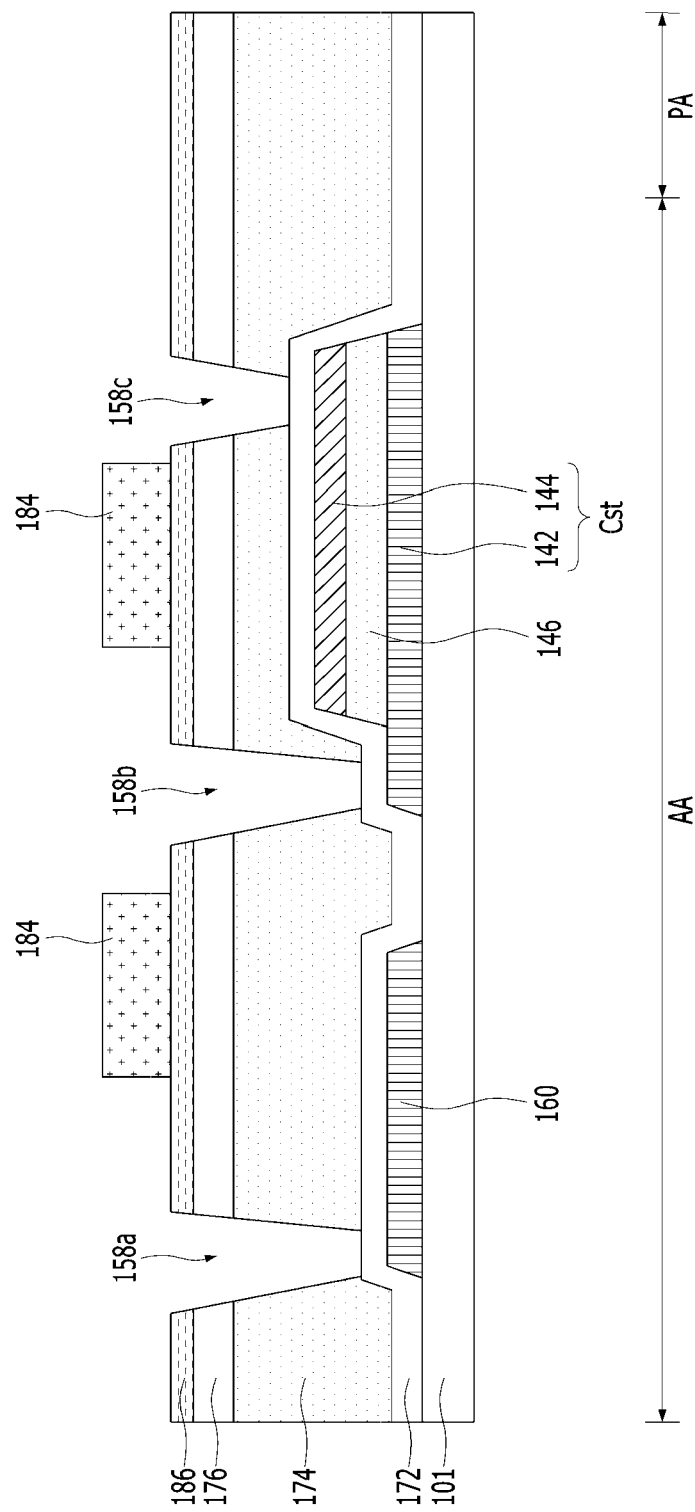

ORGANIC LIGHT-EMITTING DISPLAY DEVICE

This application claims the benefit of Korean Patent Application No. 10-2016-0170520, filed on Dec. 14, 2016, which is hereby incorporated by reference as if fully set forth herein.

BACKGROUND

Technical Field

The present invention relates to an organic light-emitting display device, and more particularly to an organic light-emitting display device that enables the realization of a high resolution.

Discussion of the Related Art

An image display device, which realizes various pieces of information on a screen, is a core technology of the information and communication age, and is being developed in the direction of becoming thinner, lighter, more portable, and having higher performance. As one example of a flat panel display device that is capable of overcoming the problems of disadvantageous weight and volume of a cathode ray tube (CRT), an organic light-emitting display (OLED) device, which displays an image by controlling the intensity of luminescence of an organic emission layer, is attracting attention. The OLED device is a self-illuminating device and is characterized by low power consumption, high response speed, high luminance efficacy, high brightness, and a wide viewing angle.

The OLED device displays an image using a plurality of subpixels, which are arranged in a matrix form. Here, each subpixel includes a light-emitting diode and a pixel-driving circuit having multiple transistors that implement independent driving of the light-emitting diode.

The light-emitting diode is formed on the multiple transistors included in the pixel-driving circuit through a mask process separately from the multiple transistors. Accordingly, as shown in FIG. 1, an emission area EA, in which the light-emitting diode is disposed, overlaps a transistor area TA, in which the multiple transistors are disposed, in the vertical direction. However, a storage capacitor included in the pixel-driving circuit is formed in the same plane and through the same mask process as the multiple transistors. Accordingly, a capacitor area CA, in which the storage capacitor is disposed, does not overlap the transistor area TA and is spaced apart from the transistor area TA in the horizontal direction. Further, signal lines electrically connected to the multiple transistors, for example, a data line DL, a high-voltage VDD supply line VL1 and a low-voltage VSS supply line VL2, are arranged to be spaced apart from each other in the horizontal direction in consideration of the effect of parasitic capacitance. As such, because the signal lines DL, VL1 and VL2, the transistor area TA and the capacitor area CA are arranged on the substrate to be spaced apart from each other in the horizontal direction, a process margin is small, which makes it difficult to realize a high resolution and reduces production yield.

SUMMARY

Accordingly, embodiments of the present disclosure are directed to an organic light-emitting display device that substantially obviates one or more problems due to limitations and disadvantages of the related art.

An aspect of the present disclosure is to provide an organic light-emitting display device that enables the realization of a high resolution.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an organic light-emitting display device comprises a storage capacitor, which overlaps a transistor, with at least one buffer layer interposed therebetween, and which includes a lower storage electrode and an upper storage electrode overlapping the lower storage electrode, with a storage buffer layer interposed therebetween. One of the lower storage electrode and the upper storage electrode is formed to have the same line width and the same shape as the storage buffer layer, thereby ensuring a sufficient process margin and consequently realizing a high resolution and improving production yield.

In one aspect, an organic light-emitting display device is provided, comprising: a storage capacitor disposed on a substrate; at least one buffer layer disposed on the storage capacitor; at least one transistor overlapping the storage capacitor, with the at least one buffer layer interposed therebetween; and a light-emitting diode connected to the transistor, wherein the storage capacitor includes a lower storage electrode and an upper storage electrode overlapping the lower storage electrode, with a storage buffer layer interposed therebetween, and wherein one of the lower storage electrode and the upper storage electrode has a same line width and a same shape as the storage buffer layer.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings:

FIGS. 5A to 5I are sectional views for explaining a method of manufacturing the organic light-emitting display device shown in FIG. 2;

FIGS. 6A to 6D are sectional views for concretely explaining a method of manufacturing a storage capacitor and a low-voltage supply line shown in FIG. 5A; and FIGS. 7A to 7E are sectional views for concretely explaining a method of manufacturing first and second inorganic buffer layers, an organic buffer layer and first and second active layers shown in FIG. 5B.

DETAILED DESCRIPTION

Reference will now be made in detail to embodiments of the present application, examples of which are illustrated in the accompanying drawings. Wherever possible, the same reference numbers will be used throughout the drawings to refer to the same or like parts.

Figure 1:
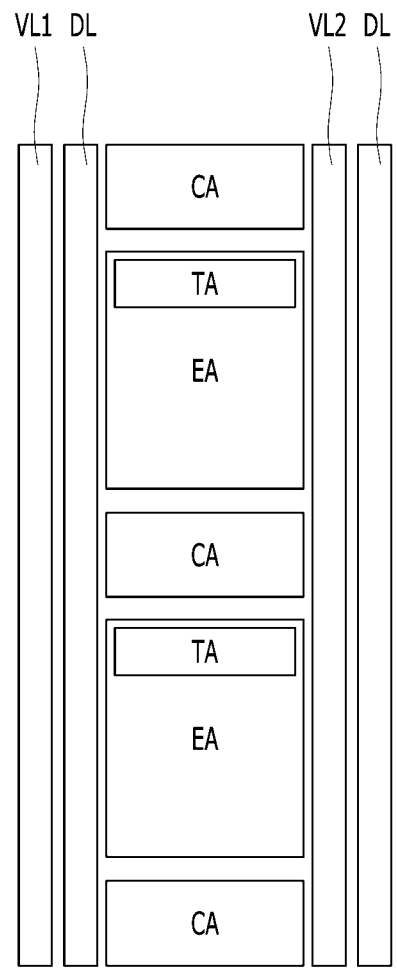
FIG. 1 is a plan view for explaining the arrangement of a transistor area, a capacitor area and an emission area of a conventional organic light-emitting display device.
Figure 2:
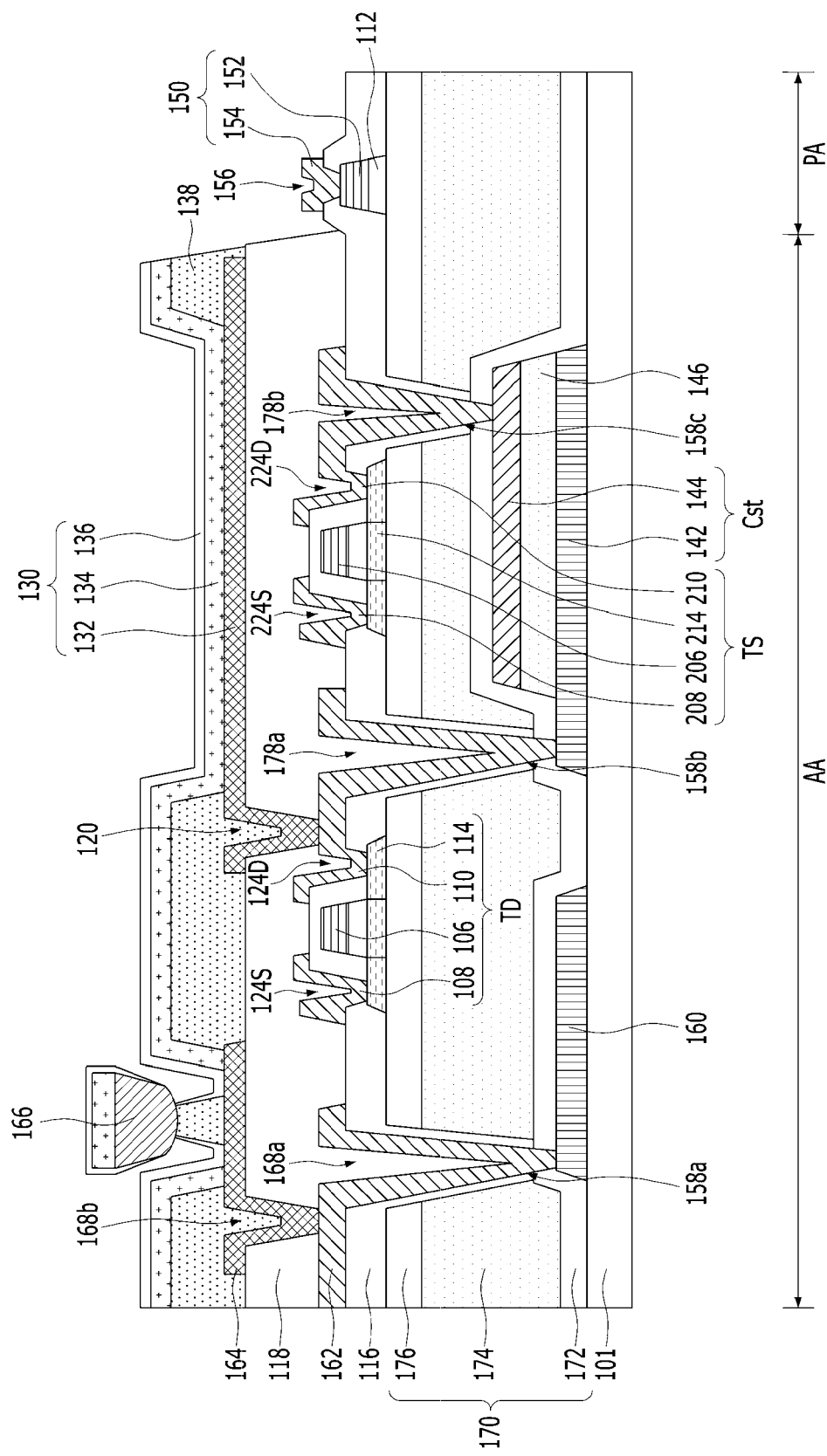
FIG. 2 is a sectional view illustrating an organic light-emitting display device according to the present invention.

FIG. 2 is a sectional view of an organic light-emitting display device according to the present invention.

The organic light-emitting display device shown in FIG. 2 includes an active area AA and a pad area PA.

A plurality of pads 150 is formed in the pad area PA in order to supply driving signals to a scan line, a data line, a high-voltage VDD supply line and a low-voltage VSS supply line 160, which are disposed in the active area AA.

Each of the pads 150 includes a pad electrode 152 and a pad cover electrode 154.

The pad electrode 152 is formed on a gate insulation pattern 112, which has the same shape as the pad electrode 152, using the same material as gate electrodes 206 and 106.

The pad cover electrode 154 is electrically connected to the pad electrode 152, which is exposed through a pad contact hole 156 that is formed to penetrate an interlayer insulation film 116. The pad cover electrode 154 is formed in the same layer as source and drain electrodes 108, 208, 110 and 210, that is, is formed on the interlayer insulation film 116 using the same material as the source and drain electrodes 108, 208, 110 and 210.

The active area AA is the area in which a plurality of subpixels is arranged in a matrix form and an image is displayed. Each of the subpixels arranged in the active area AA includes a pixel-driving circuit and a light-emitting diode 130, which is connected to the pixel-driving circuit.

The pixel-driving circuit includes a switching transistor TS, a driving transistor TD and a storage capacitor Cst.

When a scan pulse is supplied to the scan line, the switching transistor TS is turned ON and supplies a data signal, supplied to the data line, to the storage capacitor Cst and the gate electrode 106 of the driving transistor TD.

The driving transistor TD serves to adjust the magnitude of emission from the light-emitting diode 130 by controlling the current I supplied from the high-voltage supply line to the light-emitting diode 130 in response to a data signal supplied to the gate electrode 106 of the driving transistor TD. Owing to the voltage charged in the storage capacitor Cst, even if the switching transistor TS is turned OFF, the driving transistor TD makes the light-emitting diode 130 emit light by constantly supplying the current I until a data signal of the subsequent frame is supplied.

The switching transistor TS and the driving transistor TD include gate electrodes 206 and 106, source electrodes 208 and 108, drain electrodes 210 and 110, and active layers 214 and 114.

The gate electrodes 206 and 106 are formed on the gate insulation pattern 112, which has the same pattern as the gate electrodes 206 and 106. The gate electrodes 206 and 106 overlap channel regions of the active layers 214 and 114, with the gate insulation pattern 112 interposed therebetween. The gate electrodes 206 and 106 may have a single-layer structure or a multi-layer structure, which is formed of at least any one selected from among molybdenum (Mo), aluminum (Al), chrome (Cr), gold (Au), titanium (Ti), nickel (Ni), neodymium (Nd), and copper (Cu), or an alloy thereof. However, the embodiment is not limited thereto.

Figure 3:
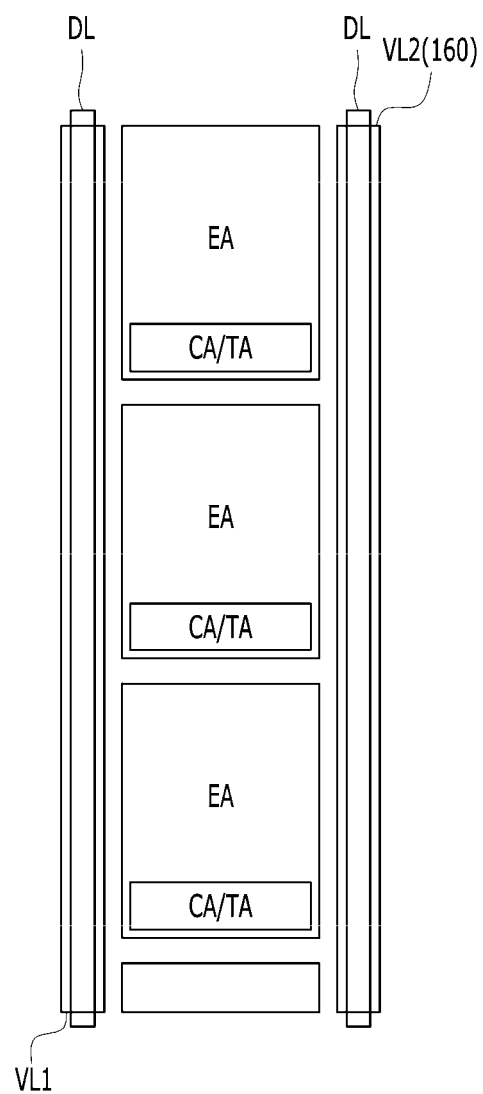
FIG. 3 is a plan view for explaining the arrangement of a transistor area, a capacitor area and an emission area of the organic light-emitting display device according to the present invention.

The source electrodes 208 and 108 are connected to source regions of the active layers 214 and 114 through source contact holes 224S and 124S, which are formed to penetrate the interlayer insulation film 116. The data line DL, which is connected to the source electrode 208 of the switching transistor, is formed of the same material as the source electrode 208 simultaneously therewith. The data line DL, as shown in FIG. 3, is arranged parallel to the low-voltage supply line VL2 (160) and the high-voltage supply line VL1, which are disposed on the substrate 101. The data line DL overlaps at least one of the low-voltage supply line VL2 (160), the high-voltage supply line VL1 and the storage capacitor Cst in the vertical direction, with at least one buffer layer 170, including an organic buffer layer 174, interposed therebetween.

The drain electrodes 210 and 110 are connected to the drain regions of the active layers 214 and 114, which are exposed through drain contact holes 224D and 124D that penetrate the interlayer insulation film 116. The drain electrode 210 of the switching transistor TS is connected to an upper storage electrode 144, which is exposed through a third open hole 158c and a second storage contact hole 178b, which are formed to penetrate the interlayer insulation film 116 and the buffer layer 170. The drain electrode 110 of the driving transistor TD is exposed through a pixel contact hole 120, which is formed to penetrate a protective layer 118, and is connected to an anode 132. The drain electrode 110 of the driving transistor TD is connected to a lower storage electrode 142, which is exposed through a second open hole 158b and a first storage contact hole 178a.

The source electrodes 208 and 108 and the drain electrodes 210 and 110 may have a single-layer structure or a multi-layer structure, which is formed of at least any one selected from among, for example, molybdenum (Mo), aluminum (Al), chrome (Cr), gold (Au), titanium (Ti), nickel (Ni), neodymium (Nd), and copper (Cu), or an alloy thereof. However, the embodiment is not limited thereto.

The active layers 214 and 114 form channel regions between the source electrodes 208 and 108 and the drain electrodes 210 and 110. The active layers 214 and 114 are disposed under the gate electrodes 206 and 106, and are formed on a second inorganic buffer layer 176. The active layers 214 and 114 are formed of at least one of an amorphous semiconductor material, a polycrystalline semiconductor material, and an oxide semiconductor material.

The active layers 214 and 114, which are formed of a polycrystalline semiconductor material, include channel regions and further include source regions and drain regions, which are disposed opposite each other with the channel regions interposed therebetween. The channel regions overlap the gate electrodes 206 and 106, with the gate insulation pattern 112 interposed therebetween. The source regions are connected to the source electrodes 208 and 108 through the source contact holes 224S and 124S, and the drain regions are connected to the drain electrodes 210 and 110 through the drain contact holes 224D and 124D. The source regions and the drain regions are formed of a semiconductor material into which an n-type or p-type dopant has been injected, and the channel regions are formed of a semiconductor material into which neither an n-type nor a p-type dopant has been injected. Although the active layers 214 and 114 shown in FIG. 2 have been described as being formed of a polycrystalline semiconductor material, the active layers may alternatively be formed of at least one of an amorphous semiconductor material and an oxide semiconductor material.

A buffer layer 170, in which a first inorganic buffer layer 172, an organic buffer layer 174 and a second inorganic buffer layer 176 are sequentially stacked, is disposed between the active layers 214 and 114 and the substrate 101.

The first inorganic buffer layer 172 is disposed on the substrate 101, on which the low-voltage supply line 160 and the lower storage electrode 142 have been formed. The first inorganic buffer layer 172 is formed of an inorganic insulation material such as, for example, SiOx, SiNx or SiON, between the organic buffer layer 174 and each of the low-voltage supply line 160 and the lower storage electrode 142. The first inorganic buffer layer 172 prevents moisture or foreign matter, which is generated at the substrate 101, from diffusing to the switching and driving transistors TS and TD. Further, the first inorganic buffer layer 172 interrupts contact between the organic buffer layer 174 and each of the low-voltage supply line 160 and the first and second storage electrodes (lower and upper storage electrodes) 142 and 144. To this end, the first inorganic buffer layer 172 is in contact with the top surface and the side surfaces of each of the low-voltage supply line 160 and the first and second storage electrodes 142 and 144. Accordingly, it is possible to prevent the low-voltage supply line 160 and the first and second storage electrodes 142 and 144 from being oxidized due to the diffusion of a solvent component contained in the organic buffer layer 174. Meanwhile, in the case in which the low-voltage supply line 160 and the first and second storage electrodes 142 and 144 are formed of a material characterized by good acid resistance and good moisture resistance, the low-voltage supply line 160 and the first and second storage electrodes 142 and 144 may be in contact with the organic buffer layer 174 without the first inorganic buffer layer 172.

The organic buffer layer 174 is formed on the first inorganic buffer layer 172 using an insulation material having a lower dielectric constant than the first and second inorganic buffer layers 172 and 176. The organic buffer layer 174 is formed of an organic material such as, for example, acrylic resin or epoxy resin. The organic buffer layer 174 is formed between each of the active layers 214 and 114 of the switching and driving thin-film transistors TS and TD and at least one signal line selected from among the scan line, the data line, the high-voltage supply line and the low-voltage supply line 160. Further, the organic buffer layer 174 is formed between a first auxiliary connection electrode 162 and the low-voltage supply line 160. Accordingly, the magnitude of the parasitic capacitance formed between at least one signal line selected from among the scan line, the data line, the high-voltage supply line and the low-voltage supply line 160, which are disposed on the substrate, and each of the auxiliary connection electrode 162 and the constituent components of the switching and driving thin-film transistors TS and TD, is reduced in proportion to the dielectric constant of the organic buffer layer 174 and in inverse proportion to the thickness of the organic buffer layer 174. Accordingly, although the signal lines DL, VL1 and VL2, which are disposed on the substrate 101, overlap the constituent components of the switching and driving thin-film transistors TS and TD and the auxiliary connection electrode 162, it is possible to minimize signal interference therebetween. Further, the organic buffer layer 174 is formed of a material having a hardening temperature equal to or higher than the temperature at which a second inorganic buffer layer 176 or the interlayer insulation film 116 is deposited on the organic buffer layer 174. The organic buffer layer 174 is formed of an organic material such as, for example, acrylic resin or epoxy resin. Accordingly, the organic buffer layer 174 has good heat resistance characteristics and is thus able to endure the deposition temperature of the second inorganic buffer layer 176 or the interlayer insulation film 116, which is disposed on the organic buffer layer 174.

In addition, the organic buffer layer 174 is formed to have first to third open holes 158a, 158b and 158c therein. The first open hole 158a is formed to have a larger width than a first auxiliary contact hole 168a and to penetrate the organic buffer layer 174 and the second inorganic buffer layer 176. Accordingly, it becomes easy to form the first auxiliary contact hole 168a, which is formed to penetrate the first inorganic buffer layer 172 and the interlayer insulation film 116 within the first open hole 158a. The second open hole 158b is formed to have a larger width than the first storage contact hole 178a and to penetrate the organic buffer layer 174 and the second inorganic buffer layer 176. Accordingly, it becomes easy to form the first storage contact hole 178a, which is formed to penetrate the first inorganic buffer layer 172 and the interlayer insulation film 116 within the second open hole 158b. The third open hole 158c is formed to have a larger width than the second storage contact hole 178b and to penetrate the organic buffer layer 174 and the second inorganic buffer layer 176. Accordingly, it becomes easy to form the second storage contact hole 178b, which is formed to penetrate the first inorganic buffer layer 172 and the interlayer insulation film 116 within the third open hole 158c.

Figure 4:
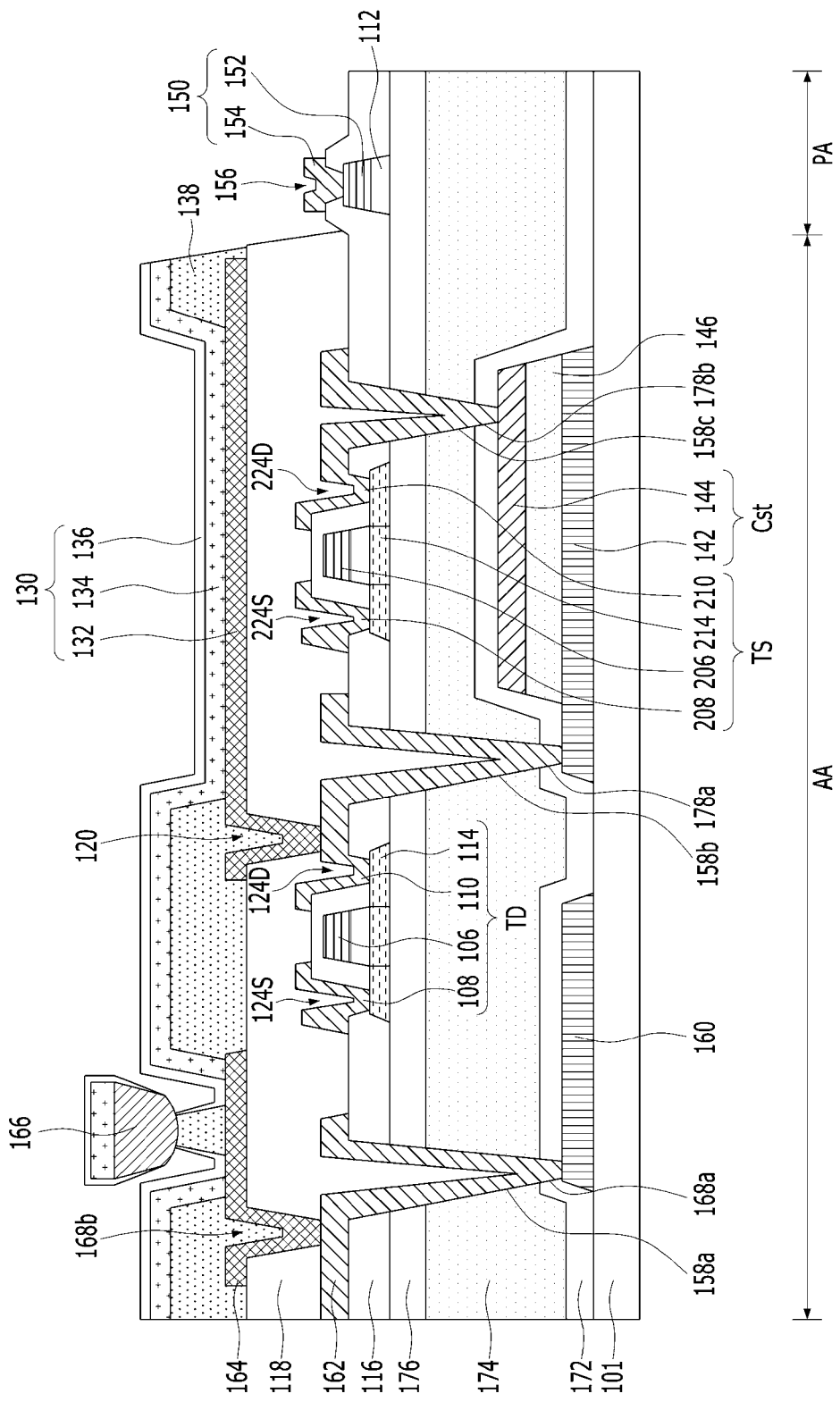
FIG. 4 is a sectional view illustrating another embodiment of the organic light-emitting display device shown in FIG. 2.

Although it has been described with reference to FIG. 2 that each of the first to third open holes 158a, 158b and 158c has a larger line width than the first auxiliary contact hole 168a and the first and second storage contact holes 178a and 178b, each of the first to third open holes 158a, 158b and 158c may alternatively be formed to have a line width similar to that of the first auxiliary contact hole 168a and the first and second storage contact holes 178a and 178b, as shown in FIG. 4. In this case, the first auxiliary connection electrode 162 and the drain electrodes 210 and 110 shown in FIG. 2 are in contact with the side surfaces of the first inorganic buffer layer 172 and the interlayer insulation film 116, which are exposed through the first auxiliary contact hole 168a and the first and second storage contact holes 178a and 178b. On the other hand, the first auxiliary connection electrode 162 and the drain electrodes 210 and 110 shown in FIG. 4 are in contact with side surfaces of the first inorganic buffer layer 172, the organic buffer layer 174, the second inorganic buffer layer 176 and the interlayer insulation film 116, which are exposed through the first to third open holes 158a, 158b and 158c, the first auxiliary contact hole 168a and the first and second storage contact holes 178a and 178b.

Like the first inorganic buffer layer 172, the second inorganic buffer layer 176 is formed of SiNx, SiOx or SiON. The second inorganic buffer layer 176 is formed on the organic buffer layer 174 to have the same line width and the same shape as the organic buffer layer 174. Accordingly, it is possible to prevent the emission of gas (fumes) from the top surface of the organic buffer layer 174, which is formed of an organic film material. Meanwhile, because the interlayer insulation film 116 is formed of SiNx, SiOx or SiON on the side surfaces of the organic buffer layer 174, which are exposed by the first to third open holes 158a, 158b and 158c, the interlayer insulation film 116 prevents emission of gas from the side surfaces of the organic buffer layer 174. Accordingly, it is possible to prevent the switching and driving transistors TS and TD from being deteriorated by gas that is generated at the top surface and the side surfaces of the organic buffer layer 174. Further, the interlayer insulation film 116 prevents the first auxiliary connection electrode 162 and the drain electrodes 210 and 110 of the switching and driving transistors from coming into contact with the organic buffer layer 174. Accordingly, it is possible to prevent the first auxiliary connection electrode 162 and the drain electrodes 210 and 110 of the switching and driving transistors from being oxidized by a solvent component contained in the organic buffer layer 174.

The storage capacitor Cst is formed such that the lower storage electrode 142 and the upper storage electrode 144 overlap, with the storage buffer layer 146 interposed therebetween. Owing to the voltage charged in the storage capacitor Cst, even if the switching transistor TS is turned OFF, the driving transistor TD makes the light-emitting diode 130 emit light by constantly supplying current until a data signal of the subsequent frame is supplied.

The storage buffer layer 146 is formed on the lower storage electrode 142 to have the same line width and the same shape as one of the lower storage electrode 142 and the upper storage electrode 144. The storage buffer layer 146 has a smaller line width than the remaining one of the lower storage electrode 142 and the upper storage electrode 144. The present invention will be described with reference to a structure in which the lower storage electrode 142 has a larger line width than the storage buffer layer 146 and the upper storage electrode 144 has the same line width and the same shape as the storage buffer layer 146. The storage buffer layer 146 is formed of an inorganic insulation material such as, for example, SiOx, SiNx or SiON, and may be formed of the same material as the first inorganic buffer layer 172.

The lower storage electrode 142 is formed in the same layer using the same material as the low-voltage supply line 160, and is exposed through the first storage contact hole 178a and is electrically connected to the drain electrode 110 of the driving transistor TD. Since the top surface and the side surfaces of the lower storage electrode 142 are in contact with the first inorganic buffer layer 172 and the storage buffer layer 146, it is possible to prevent the lower storage electrode 142 from being oxidized due to coating and heat treatment of the organic buffer layer 174.

The upper storage electrode 144 is exposed through the second storage contact hole 178b and is electrically connected to the drain electrode 210 of the switching transistor TS. Since the top surface and the side surfaces of the upper storage electrode 144 are in contact with the first inorganic buffer layer 172, it is possible to prevent the upper storage electrode 144 from being oxidized due to coating and heat treatment of the organic buffer layer 174.

The lower storage electrode 142 and the low-voltage supply line 160 are formed to overlap the switching and driving transistors TS and TD and the active layers 214 and 114 using an opaque metal such as, for example, Mo, Ti, Al, Cu, Cr, Co, W, Ta, or Ni. Accordingly, the lower storage electrode 142 and the low-voltage supply line 160 absorb or reflect light incident thereon from the outside, thereby preventing external light from being incident on the channel regions of the active layers 214 and 114 of the switching and driving transistors TS and TD.

The light-emitting diode 130 includes an anode 132, which is connected to the drain electrode 110 of the driving transistor TD, at least one light-emitting stack 134, which is formed on the anode 132, and a cathode 136, which is formed on the light-emitting stack 134.

The anode 132 is disposed on a planarization layer (protective layer) 118 and is exposed through a bank 138. The anode 132 is electrically connected to the drain electrode 110 of the driving transistor TD, which is exposed through the pixel contact hole 120. Like the auxiliary connection electrode 164, the anode 132 is formed in a multi-layer structure including a transparent conductive film and an opaque conductive film having high reflection efficiency. The transparent conductive film is formed of a material having a relatively high work function, e.g. indium-tin-oxide (ITO) or indium-zinc-oxide (IZO), and the opaque conductive film is formed in a single-layer or multi-layer structure including at least any one selected from among Al, Ag, Cu, Pb, Mo, and Ti or an alloy thereof. For example, the anode 132 may be formed in a structure such that a transparent conductive film, an opaque conductive film and a transparent conductive film are sequentially stacked, or such that a transparent conductive film and an opaque conductive film are sequentially stacked.

The light-emitting stack 134 is formed by stacking, on the anode 132, a hole-related layer, an organic emission layer, and an electron-related layer, either in that order or in the reverse order. In addition, the light-emitting stack 134 may include first and second light-emitting stacks, which are opposite each other with a charge generation layer interposed therebetween. In this case, an organic emission layer of any one of the first and second light-emitting stacks generates blue light, and an organic emission layer of the remaining one of the first and second light-emitting stacks generates yellow-green light, with the result that white light is generated via the first and second light-emitting stacks. The white light generated by the light-emitting stack 134 is introduced into a color filter (not shown) disposed on the light-emitting stack 134, and consequently a color image is realized. Alternatively, it may be possible to realize a color image in a manner such that each light-emitting stack 134 generates colored light corresponding to each subpixel without a separate color filter. That is, a light-emitting stack 134 of a red (R) subpixel may generate red light, a light-emitting stack 134 of a green (G) subpixel may generate green light, and a light-emitting stack 134 of a blue (B) subpixel may generate blue light.

The bank 138 may be formed to expose the anode 132 and the second auxiliary connection electrode 164. The bank 138 may be formed of an opaque material (e.g. a black material) in order to prevent optical interference between neighboring subpixels. In this case, the bank 138 includes a light-shielding material including at least one of a color pigment, organic black and carbon materials.

A partition 166 separates the light-emitting stacks 134, which are disposed in neighboring subpixels that realize mutually different colors, from each other. To this end, the partition 166 is formed on the bank 138, which is disposed on the second auxiliary connection electrode 164, and has an inversely tapered shape. The width of the inversely-tapered-shaped partition 166 gradually increases from the bottom surface thereof to the top surface thereof.

The light-emitting stack 134, which is grown straight, is not formed on the second auxiliary connection electrode 164, which overlaps the inversely-tapered-shaped partition 166. Therefore, the light-emitting stacks 134, which are disposed in neighboring subpixels that realize different colors from each other, are separated from each other on the second auxiliary connection electrode 164 by the partition 166. In this case, the light-emitting stack 134 is formed only on the top surface of the anode 132 exposed by the bank 138, the top surface of the partition 166, and the top surface and the side surfaces of the bank 138. On the other hand, because the cathode 136, which has step coverage superior to that of the light-emitting stack 134, is also formed on the top surface and the side surfaces of the partition 166 and the side surfaces of the bank 138 disposed under the partition 166, the cathode 136 may be easily brought into contact with the second auxiliary connection electrode 164.

The cathode 136 is formed on the top surfaces and the side surfaces of the light-emitting stack 134 and the bank 138 to be opposite the anode 132 with the light-emitting stack 134 interposed therebetween. In the case in which the cathode 136 is applied to a top-emission-type organic light-emitting display device, the cathode 136 is a transparent conductive film formed of, for example, indium-tin-oxide (ITO) or indium-zinc-oxide (IZO).

The cathode 136 is connected to the low-voltage supply line 160 via the first and second auxiliary connection electrodes 162 and 164.

The low-voltage supply line 160 overlaps the driving transistor TD, with the first inorganic buffer layer 172, the organic buffer layer 174 and the second inorganic buffer layer 176 interposed therebetween. The low-voltage supply line 160 is formed on the substrate 101 using the same material as the lower storage electrode 142.

The first auxiliary connection electrode 162 is electrically connected to the low-voltage supply line 160, which is exposed through the first auxiliary contact hole 168a penetrating the interlayer insulation film 116. The first auxiliary connection electrode 162 is formed in the same plane as the source and drain electrodes 208, 108, 210 and 110, that is, is formed on the interlayer insulation film 116 using the same material as the source and drain electrodes 208, 108, 210 and 110.

The second auxiliary connection electrode 164 is electrically connected to the first auxiliary connection electrode 162, which is exposed through the second auxiliary contact hole 168b penetrating the planarization layer 118. The second auxiliary connection electrode 164 is formed in the same plane as the anode 132, that is, is formed on the planarization layer 118 using the same material as the anode 132.

Because the low-voltage supply line 160 and the first and second auxiliary connection electrodes 162 and 164 are formed of a metal having conductivity superior to that of the cathode 136, the low-voltage supply line 160 and the first and second auxiliary connection electrodes 162 and 164 may compensate for the high resistance of the cathode 136, which is a transparent conductive film formed of ITO or IZO.

As described above, according to the present invention, as shown in FIG. 2, the switching transistor TS overlaps one of the low-voltage supply line 160 and the storage capacitor Cst in the vertical direction, with at least one buffer layer, including the organic buffer layer 174, interposed therebetween, and the driving transistor TD overlaps the remaining one of the low-voltage supply line 160 and the storage capacitor Cst, with at least one of the buffer layers 172, 174 and 176 interposed therebetween. Accordingly, as shown in FIG. 3, the capacitor area CA, in which the storage capacitor Cst is disposed, overlaps the emission area EA and the transistor area TA, thereby ensuring a sufficient process margin and consequently realizing a high resolution and improving production yield. Further, the data line DL, as shown in FIG. 3, overlaps at least one of the high-voltage supply line VL1 and the low-voltage supply line VL2 (160) in the vertical direction, with at least one buffer layer, including the organic buffer layer 174, interposed therebetween. As a result, it is possible to ensure a sufficient process margin and consequently to realize a high resolution and improve production yield.

FIGS. 5A to 5I are sectional views for explaining a method of manufacturing the organic light-emitting display device shown in FIG. 2.

Referring to FIG. 5A, the lower storage electrode 142, the low-voltage supply line 160, the storage buffer layer 146 and the upper storage electrode 144 are formed on the substrate 101. This will now be described in detail with reference to FIGS. 6A to 6D.

Figure 6A:
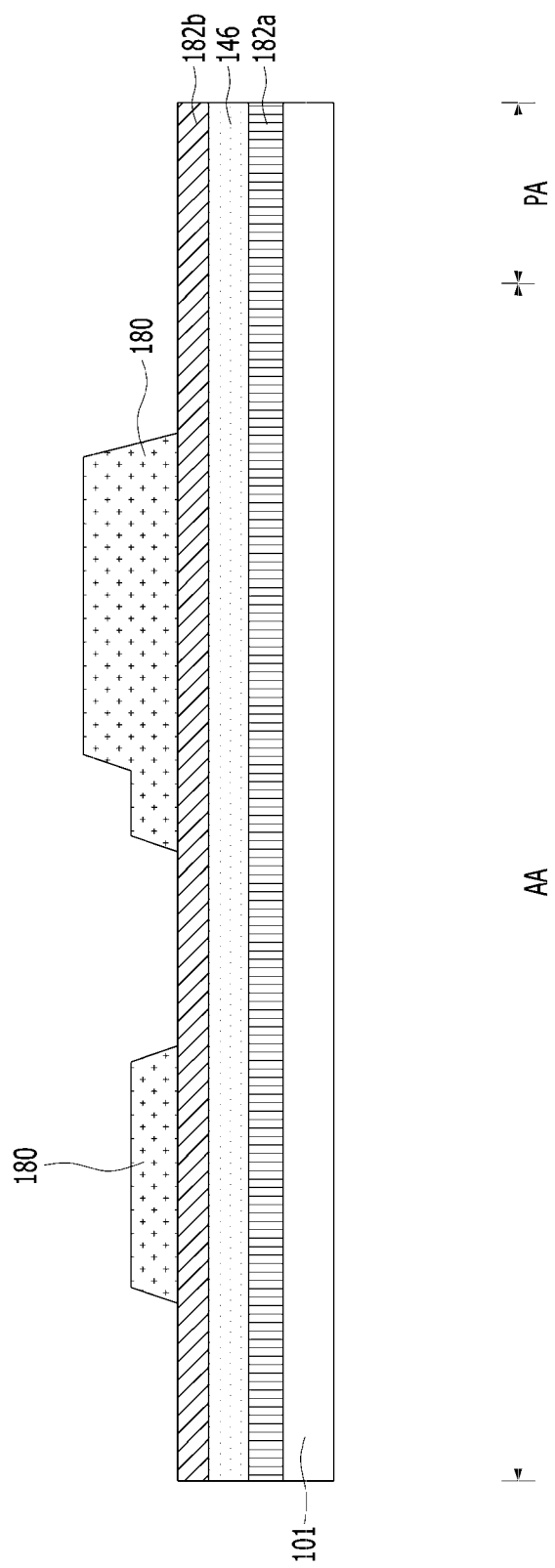
Figure 6B:
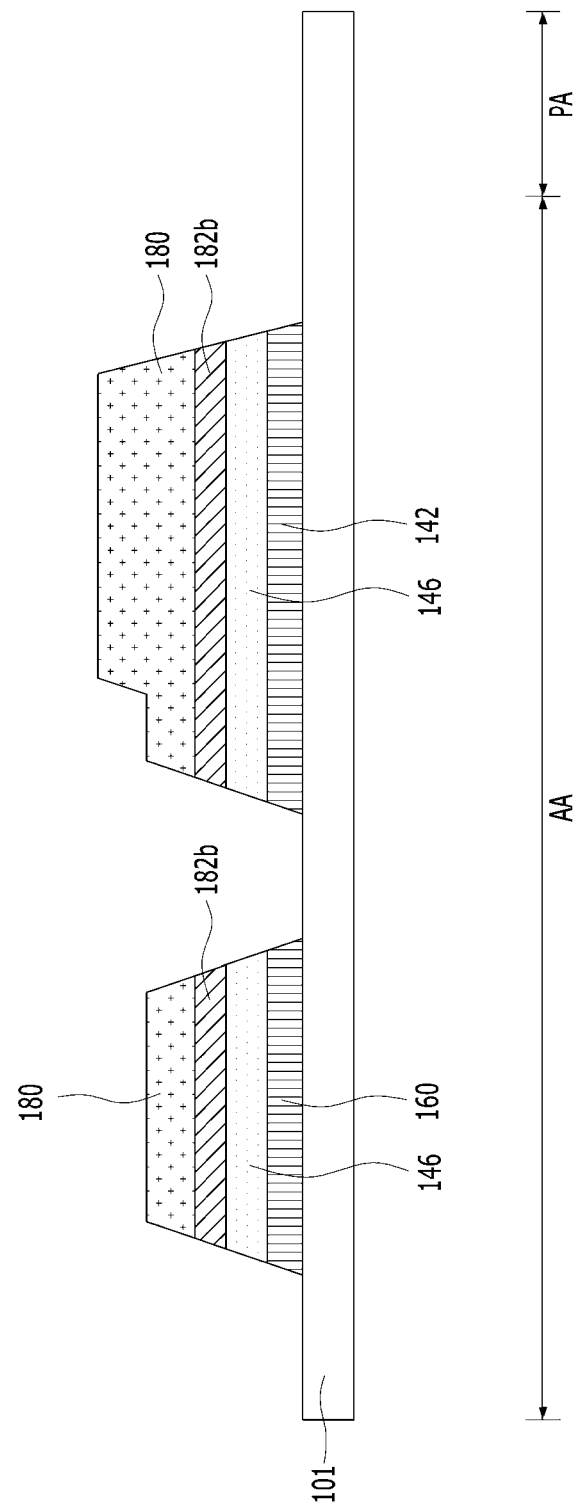

Specifically, as shown in FIG. 6A, the first conductive layer 182a, the storage buffer layer 146 and the second conductive layer 182b are sequentially stacked on the substrate 101. Subsequently, a photoresist is coated on the entire surface of the second conductive layer 182b and is then patterned through a photolithography process using a first mask, such as a half-tone mask or a slit mask, whereby the first photoresist pattern 180 having a multi-stage structure is formed. The first photoresist pattern 180 having a multi-stage structure is formed to a first thickness in the region in which the upper storage electrode 144 is to be formed, and is formed to a second thickness, which is less than the first thickness, in the region in which the lower storage electrode 142 and the low-voltage supply line 160 are to be formed. The first photoresist pattern 180 is not formed in the remaining region. The second conductive layer 182b and the storage buffer layer 146 are etched through a wet-etching process using the first photoresist pattern 180 having a multi-stage structure as a mask, and the first conductive layer 182a is etched through a dry-etching process. After this etching process, in the case in which the side surfaces of the second conductive layer 182b and the storage buffer layer 146 protrude further than the first conductive layer 182a, the second conductive layer 182b and the storage buffer layer 146 may be secondarily etched through a wet-etching process. Through these etching processes, as shown in FIG. 6B, the lower storage electrode 142 and the low-voltage supply line 160 are formed, and the second conductive layer 182b and the storage buffer layer 146, which have the same patterns as the lower storage electrode 142 and the low-voltage supply line 160, are formed on each of the lower storage electrode 142 and the low-voltage supply line 160.

Subsequently, as shown in FIG. 6C, the first photoresist pattern 180 is ashed through an ashing process such that the portion of the first photoresist pattern 180 that has the first thickness is made thinner and the portion of the first photoresist pattern 180 that has the second thickness is removed. The second conductive layer 182b and the storage buffer layer 146 are etched through a wet-etching process using the portion of the first photoresist pattern 180, which was made thinner, as a mask. Accordingly, as shown in FIG. 6D, the second conductive layer 182b and the storage buffer layer 146, which are disposed on the low-voltage supply line 160, are removed, and the second conductive layer 182b and the storage buffer layer 146, which are disposed on the lower storage electrode 142, which is exposed by the first photoresist pattern 180, are partially removed, whereby the storage buffer layer 146 and the upper storage electrode 144, each having a smaller line width than the lower storage electrode 142, are formed.

Referring to FIG. 5B, the first inorganic buffer layer 172, the organic buffer layer 174, the second inorganic buffer layer 176 and the active layers 214 and 114 of the switching and driving transistors TS and TD are formed on the substrate 101, on which the low-voltage supply line 160, the lower storage electrode 142, the storage buffer layer 146 and the upper storage electrode 144 have been formed. This will now be described in detail with reference to FIGS. 7A to 7E.

Figure 7A:
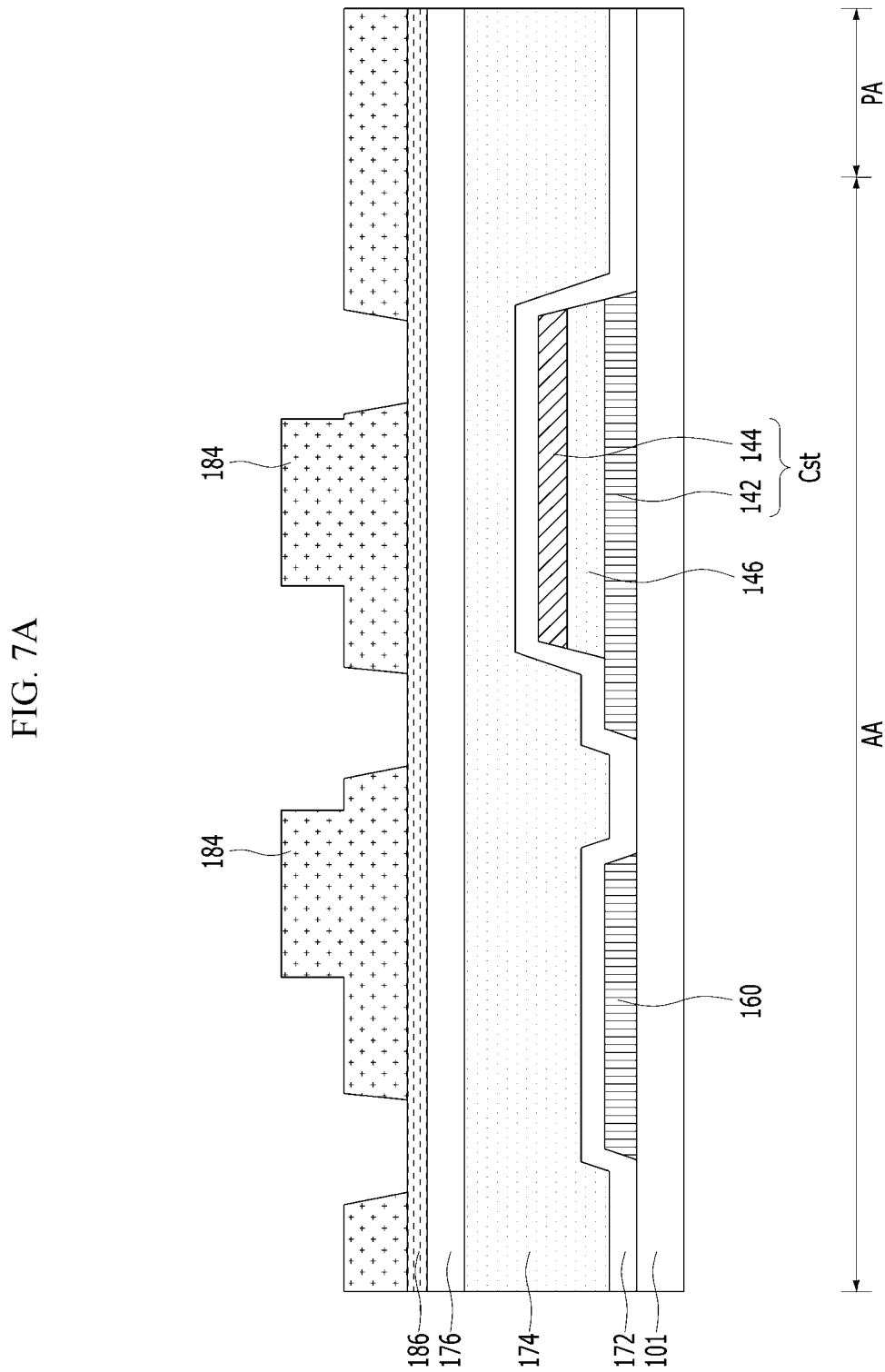
Figure 7B:
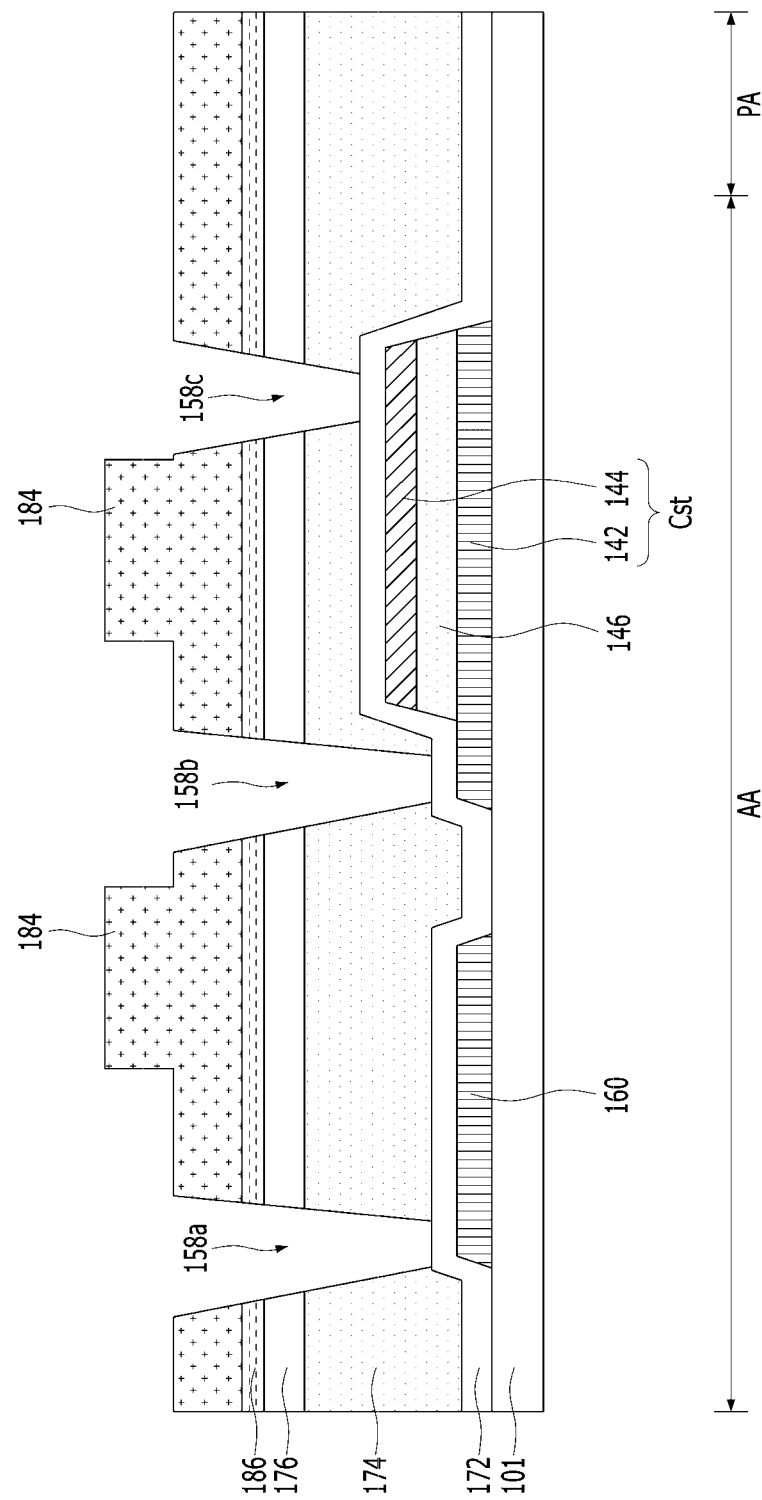
Figure 7D:
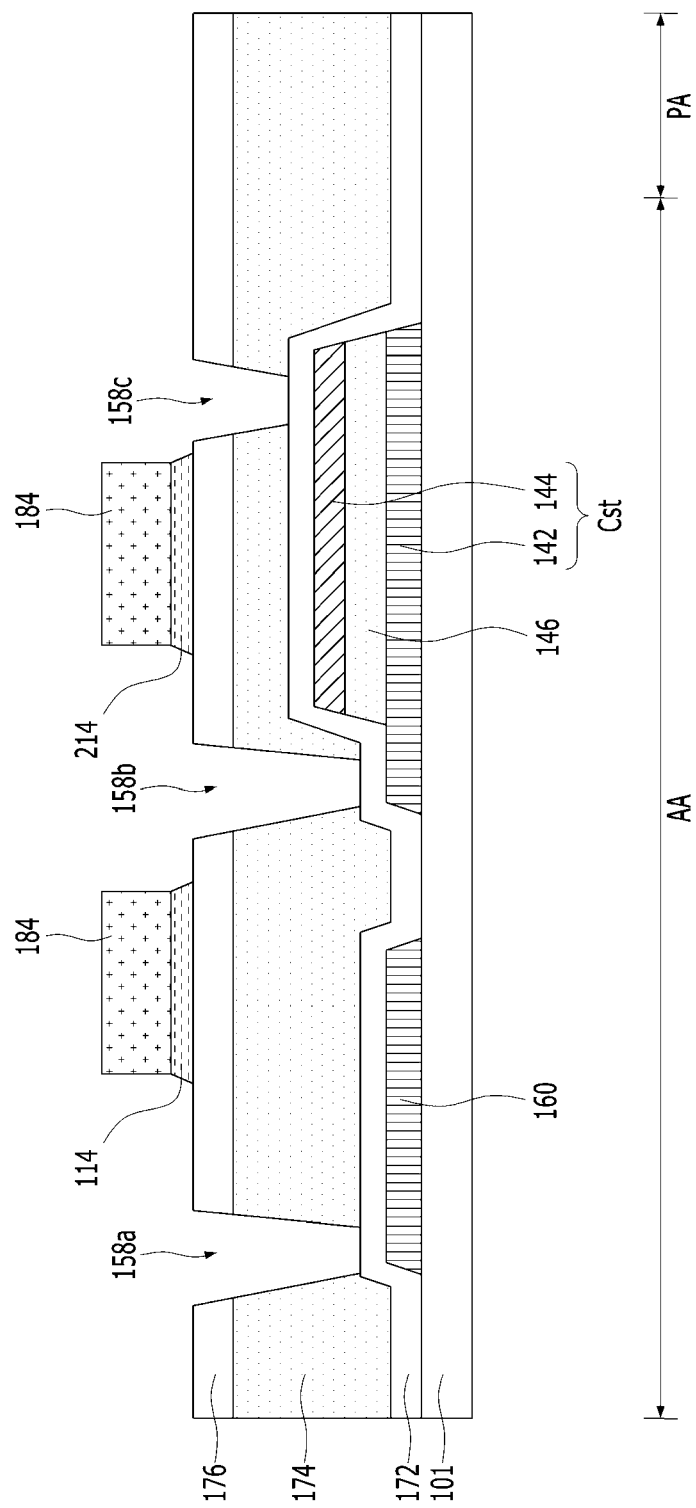
Figure 7E:
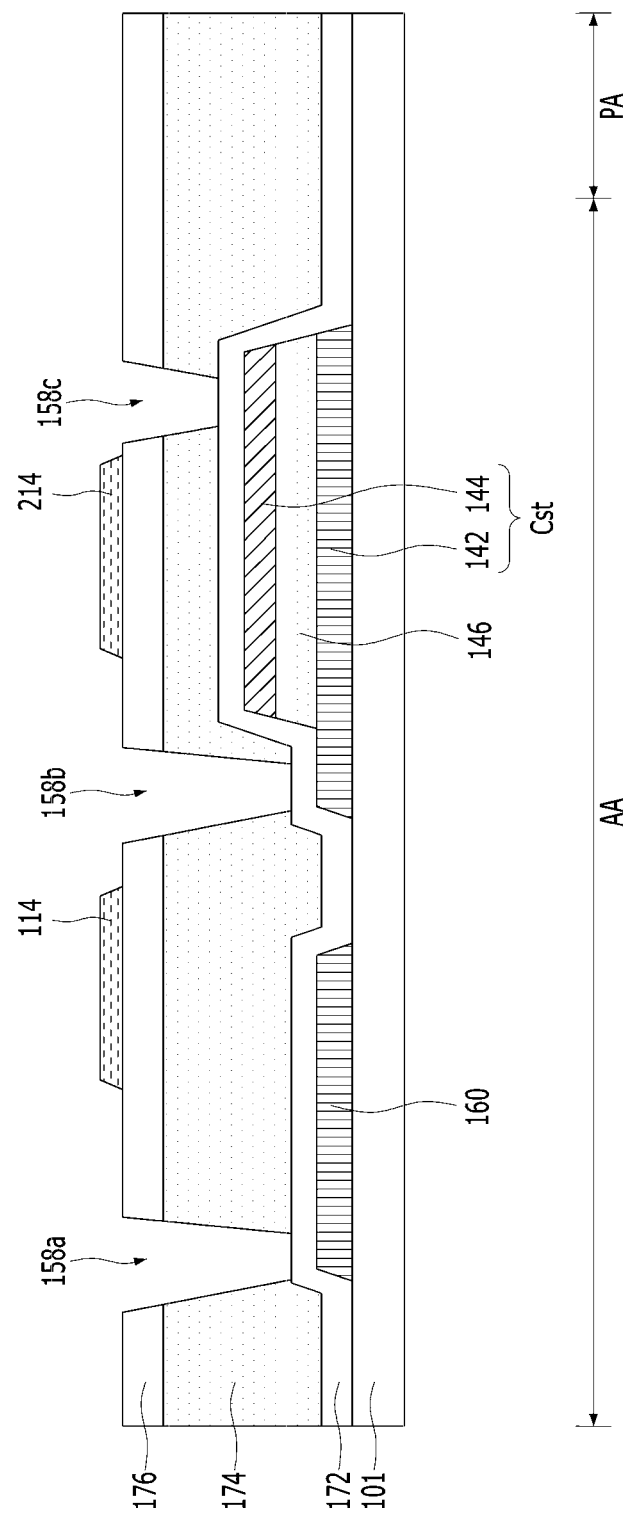

As shown in FIG. 7A, the first inorganic buffer layer 172, the organic buffer layer 174, the second inorganic buffer layer 176 and the semiconductor film 186 are formed on the substrate 101, on which the low-voltage supply line 160, the lower storage electrode 142, the storage buffer layer 146 and the upper storage electrode 144 have been formed. Subsequently, a photoresist is coated on the entire surface of the semiconductor film 186 and is then patterned through a photolithography process using a second mask, such as a half-tone mask or a slit mask, whereby the second photoresist pattern 184 having a multi-stage structure is formed. The second photoresist pattern 184 having a multi-stage structure is formed to a first thickness in the region in which the active layers 214 and 114 are to be formed, is not formed in the region in which the first to third open holes 158a, 158b and 158c are to be formed, and is formed in the remaining region to a second thickness, which is less than the first thickness. The organic buffer layer 174, the second inorganic buffer layer 176 and the semiconductor film 186 are patterned through an etching process using the second photoresist pattern 184 having a multi-stage structure as a mask, whereby, as shown in FIG. 7B, the first to third open holes 158a, 158b and 158c, which expose the top surface of the first inorganic buffer layer 172, are formed. Subsequently, as shown in FIG. 7C, the second photoresist pattern 184 is ashed such that the portion of the second photoresist pattern 184 that has the first thickness is made thinner and the portion of the second photoresist pattern 184 that has the second thickness is removed. The exposed semiconductor film 186 is removed through an etching process using the portion of the second photoresist pattern 184 that was made thinner as a mask, whereby, as shown in FIG. 7D, the active layers 214 and 114 of the switching and driving transistors TS and TD are formed. Subsequently, the second photoresist pattern 184, which remains on the active layers 214 and 114 of the switching and driving transistors TS and TD, as shown in FIG. 7E, is removed through a stripping process.

Figure 5C:
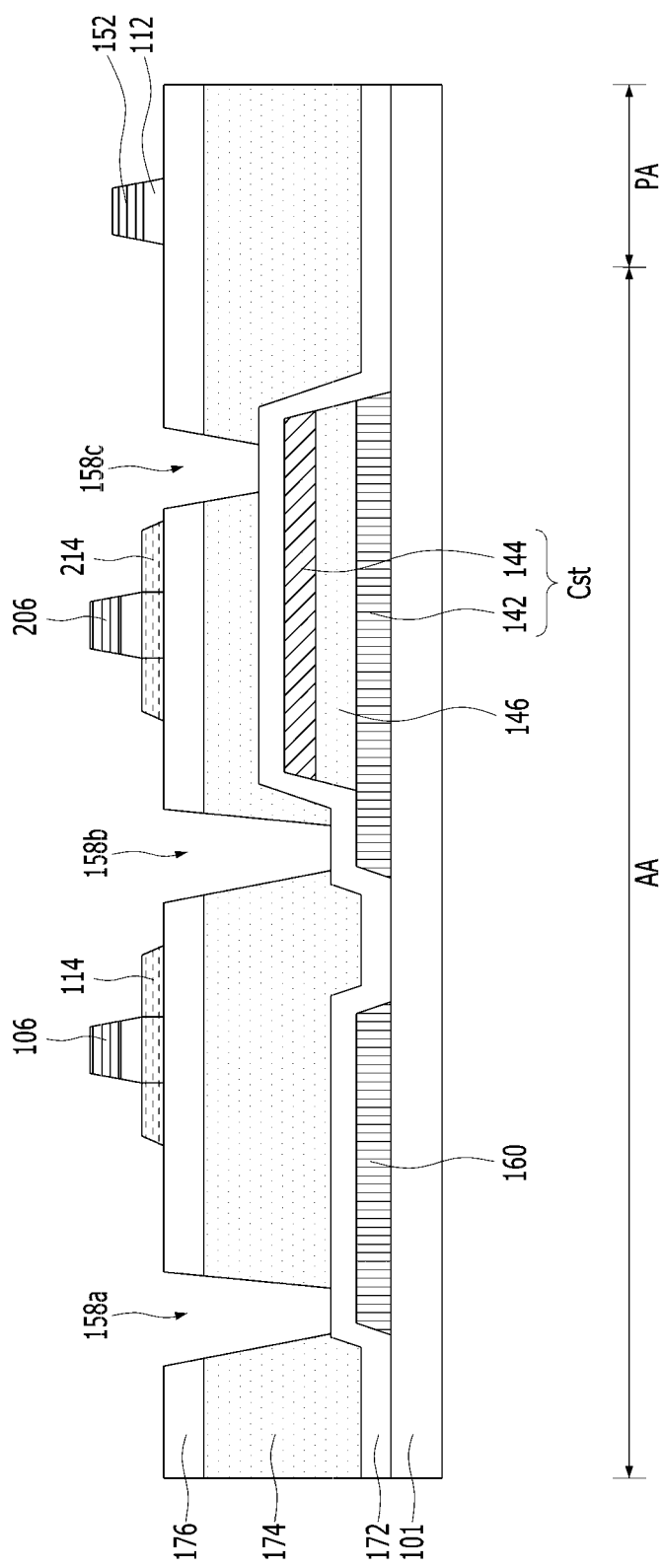

Referring to FIG. 5C, the gate insulation pattern 112 is formed on the substrate 101, on which the active layers 214 and 114 of the switching and driving transistors TS and TD have been formed, and the gate electrodes 206 and 106 of the switching and driving transistors TS and TD and the pad electrode 152 are formed on the gate insulation pattern 112.

Specifically, the gate insulation film is formed on the substrate 101, on which the first and second active layers 214 and 114 have been formed, and a third conductive layer is formed on the gate insulation film through, for example, a sputtering deposition method. The gate insulation film is formed of an inorganic insulation material such as SiOx or SiNx. The third conductive layer may have a single-layer structure or a multi-layer structure, which is formed of a metal material such as, for example, Mo, Ti, Cu, AlNd, Al, Cr, or an alloy thereof. Subsequently, the third conductive layer and the gate insulation film are patterned at the same time through a photolithography process and an etching process, whereby the gate electrodes 206 and 106 of the switching and driving transistors TS and TD and the pad electrode 152 are formed and the gate insulation pattern 112, which is disposed under each of the gate electrodes 206 and 106 of the switching and driving transistors TS and TD and the pad electrode 152, is formed to have the same pattern as each of the same. Subsequently, the source regions and the drain regions of the active layers 214 and 114 are formed by injecting an $n^+$-type or $p^+$-type dopant into the active layers 214 and 114 using the gate electrodes 206 and 106 as a mask.

Figure 5D:
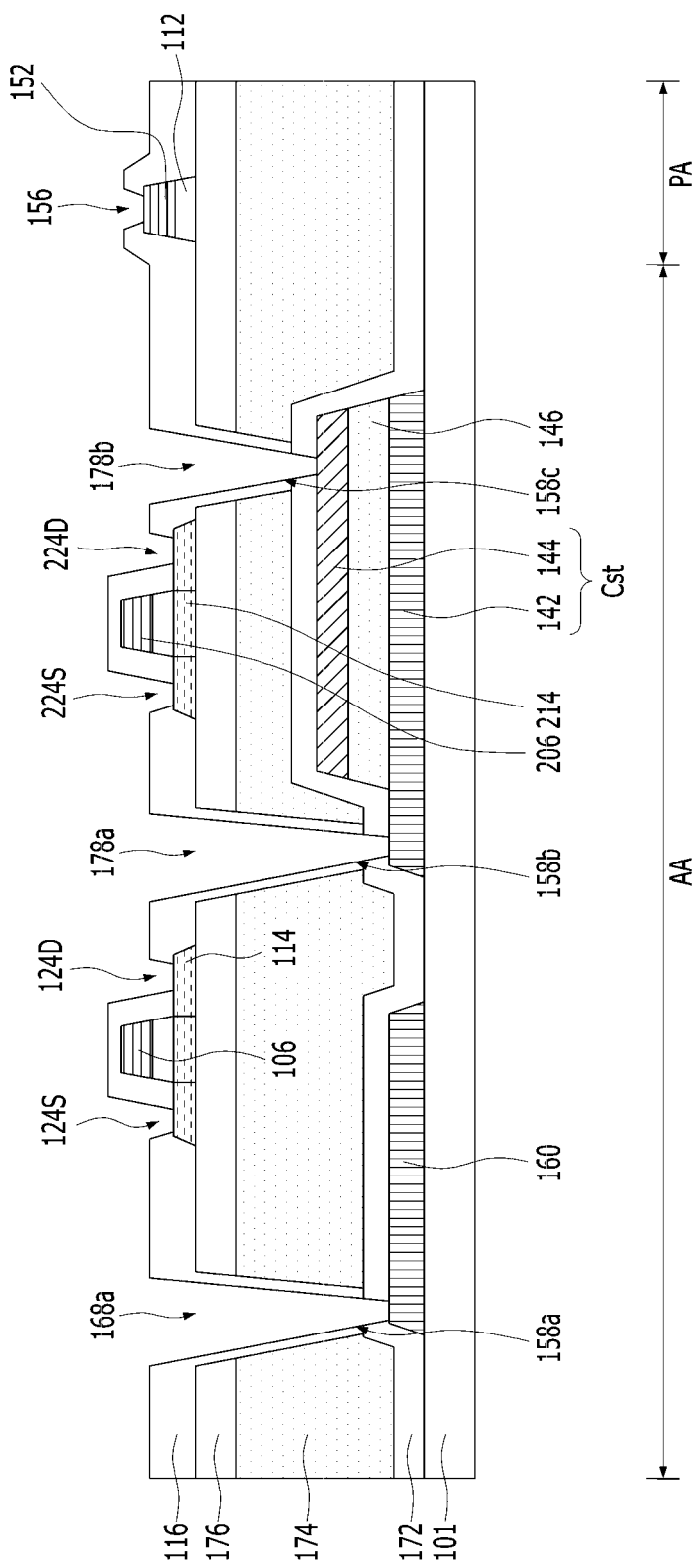

Referring to FIG. 5D, the interlayer insulation film 116, which has therein the source and drain contact holes 224S, 124S, 224D and 124D, the pad contact hole 156, the first and second storage contact holes 178a and 178b and the first auxiliary contact hole 168a, is formed on the substrate 101, on which the gate electrodes 206 and 106 of the switching and driving transistors TS and TD and the pad electrode 152 have been formed.

Specifically, the interlayer insulation film 116 is formed on the substrate 101, on which the gate electrodes 206 and 106 and the pad electrode 152 have been formed, through, for example, a plasma-enhanced chemical vapor deposition (PECVD) method. Subsequently, the interlayer insulation film 116 and the first inorganic buffer layer 172 are patterned through a photolithography process and an etching process, whereby the source and drain contact holes 224S, 124S, 224D and 124D, the pad contact hole 156, the first and second storage contact holes 178a and 178b and the first auxiliary contact hole 168a are formed. Each of the source and drain contact holes 224S, 124S, 224D and 124D, and the pad contact hole 156 is formed to penetrate the interlayer insulation film 116. The first auxiliary contact hole 168a and the first and second storage contact holes 178a and 178b are formed to penetrate the interlayer insulation film 116 and the first inorganic buffer layer 172.

Figure 5E:
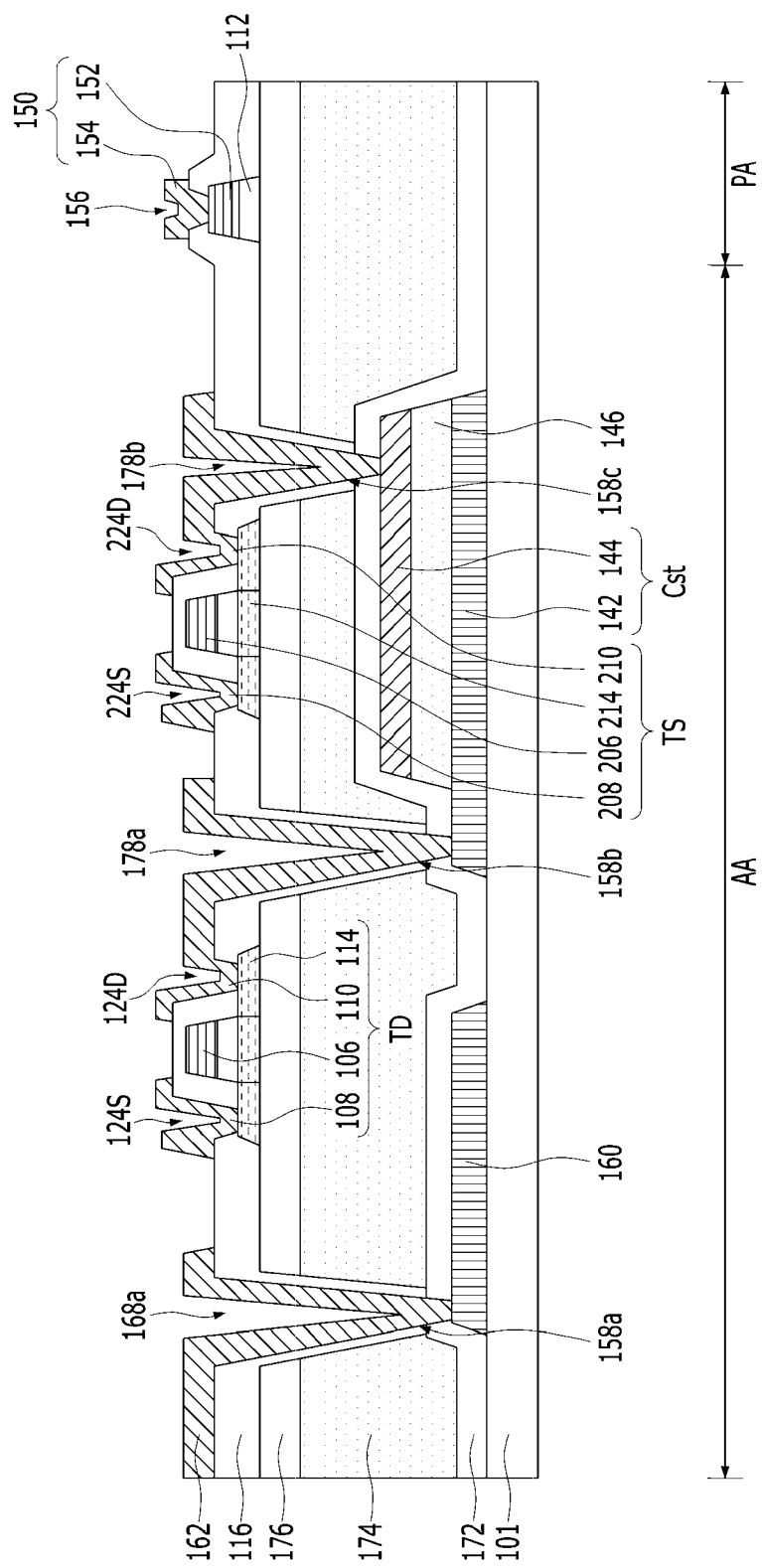

Referring to FIG. 5E, the data line DL, the source electrodes 208 and 108 of the switching and driving transistors TS and TD, the drain electrodes 210 and 110 of the switching and driving transistors TS and TD, the first auxiliary connection electrode 162 and the pad cover electrode 154 are formed on the interlayer insulation film 116, which has therein the source and drain contact holes 224S, 124S, 224D and 124D, the pad contact hole 156, the first and second storage contact holes 178a and 178b and the first auxiliary contact hole 168a.

Specifically, a fourth conductive layer is formed on the interlayer insulation film 116, which has therein the source and drain contact holes 224S, 124S, 224D and 124D, the pad contact hole 156, the first and second storage contact holes 178a and 178b and the first auxiliary contact hole 168a, through, for example, a sputtering deposition method. The fourth conductive layer may have a single-layer structure or a multi-layer structure, which is formed of a metal material such as, for example, Mo, Ti, Cu, AlNd, Al, Cr, or an alloy thereof. Subsequently, the fourth conductive layer is patterned through a photolithography process and an etching process, whereby the data line DL, the source electrodes 208 and 108, the drain electrodes 210 and 110, the first auxiliary connection electrode 162 and the pad cover electrode 154 are formed.

Figure 5F:
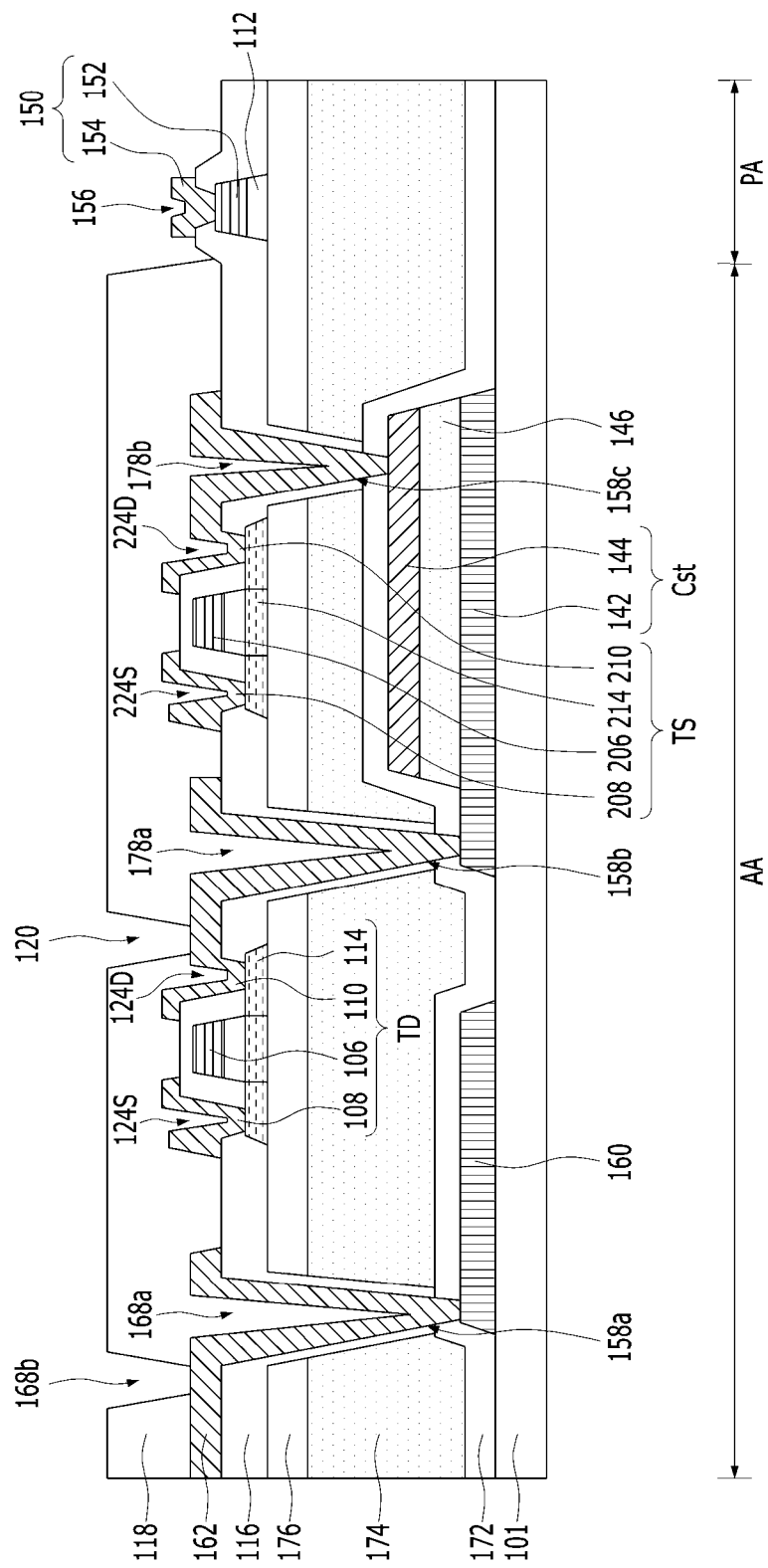

Referring to FIG. 5F, the planarization layer 118, which has therein the second auxiliary contact hole 168b and the pixel contact hole 120, is formed on the substrate 101, on which the source electrodes 208 and 108, the drain electrodes 210 and 110, the first auxiliary connection electrode 162 and the pad cover electrode 154 have been formed.

Specifically, the planarization layer 118 is formed on the interlayer insulation film 116, on which the source electrodes 208 and 108, the drain electrodes 210 and 110, the first auxiliary connection electrode 162 and the pad cover electrode 154 have been formed, through a coating process. The planarization layer 118 is formed of an organic insulation material such as, for example, photo acryl. Subsequently, the planarization layer 118 is patterned through a photolithography process and an etching process, whereby the pixel contact hole 120 and the second auxiliary contact hole 168b are formed. The pixel contact hole 120 is formed to penetrate the planarization layer 118 to expose the drain electrode 110 of the driving transistor TD, and the second auxiliary contact hole 168b is formed to penetrate the planarization layer 118 to expose the first auxiliary connection electrode 162. Subsequently, the planarization layer 118, which is disposed on the pad cover electrode 154, is removed, whereby the pad cover electrode 154 is exposed outside.

Figure 5G:
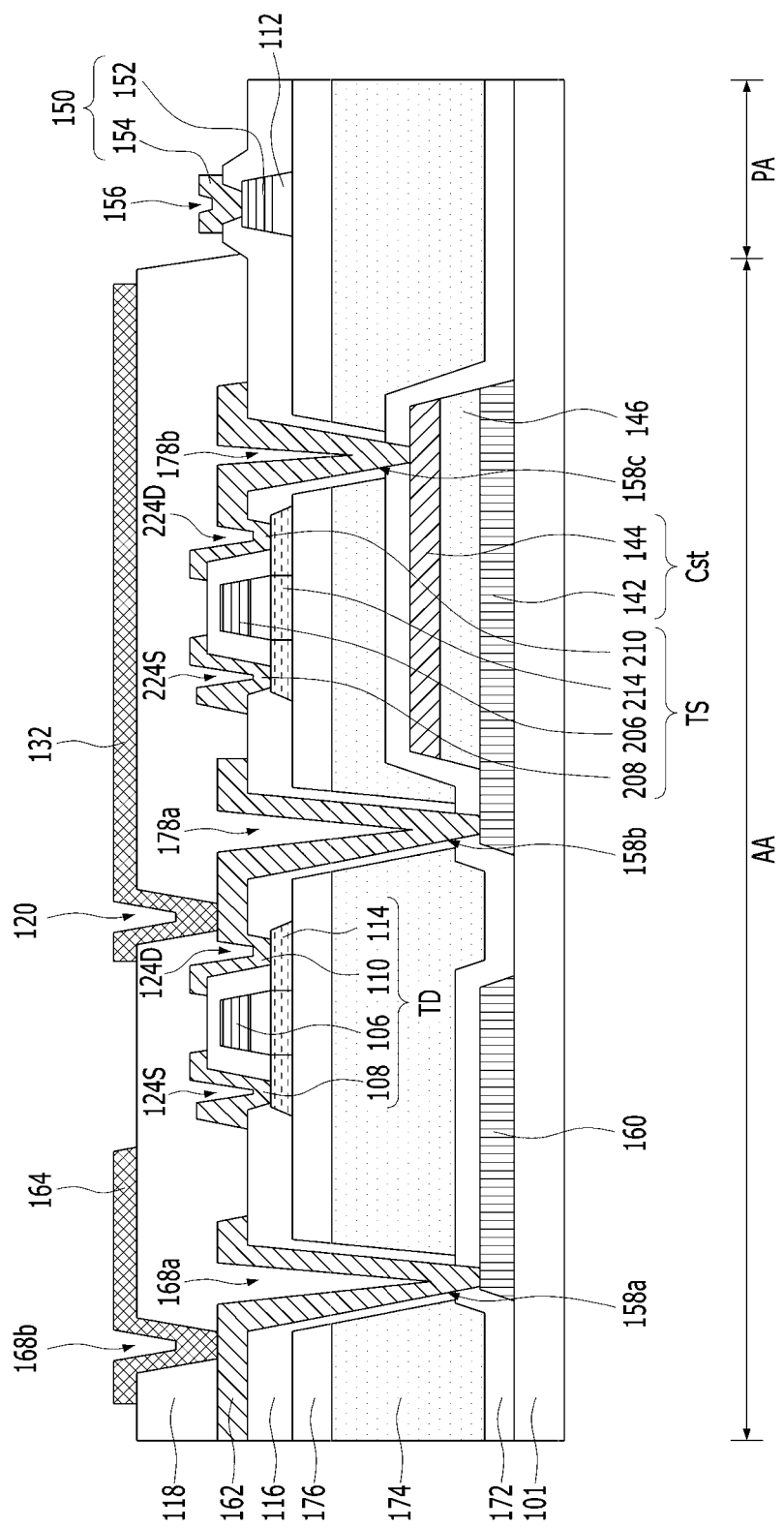

Referring to FIG. 5G, the anode 132 and the second auxiliary connection electrode 164 are formed on the substrate 101, on which the planarization layer 118, which has therein the pixel contact hole 120 and the second auxiliary contact hole 168b, has been formed.

Specifically, a photosensitive film is coated on the entire surface of the substrate 101, on which the planarization layer 118 has been formed, and is then patterned through a photolithography process, whereby a photosensitive protective film (not illustrated) is formed to cover the pad portion. Subsequently, a fifth conductive layer is coated on the entire surface of the substrate 101, on which the photosensitive protective film has been formed, and is then patterned through a photolithography process and an etching process, whereby the anode 132 and the second auxiliary connection electrode 164 are formed. Meanwhile, the photosensitive protective film is removed together with the photosensitive film, which was used for the patterning of the fifth conductive layer, through a stripping process.

Figure 5H:
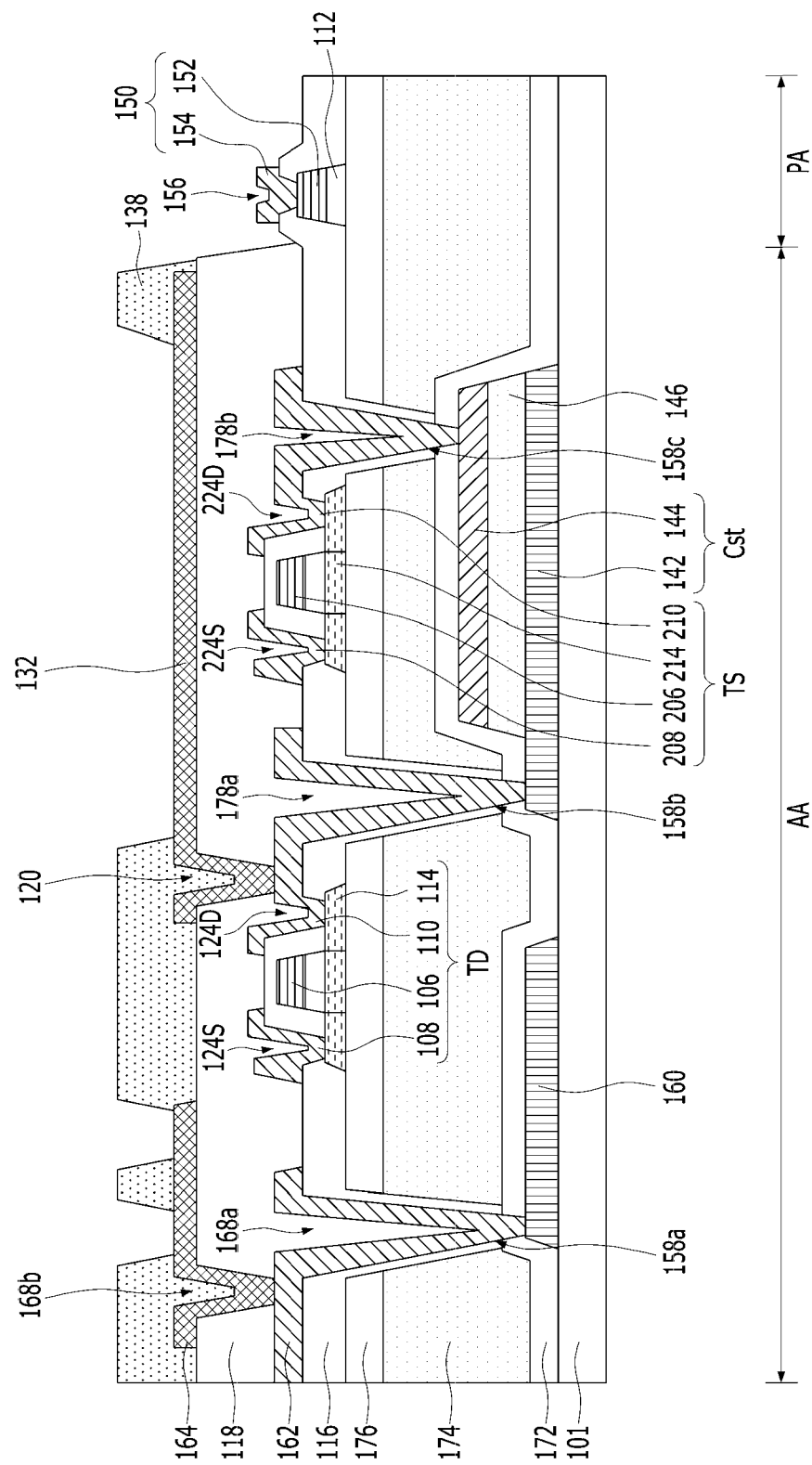

Referring to FIG. 5H, the bank 138 is formed on the substrate 101, on which the anode 132 and the second auxiliary connection electrode 164 have been formed.

Specifically, a photosensitive film for the bank is coated on the entire surface of the substrate 101, on which the anode 132 and the second auxiliary connection electrode 164 have been formed, and is then patterned through a photolithography process, whereby the bank 138 is formed.

Figure 5I:
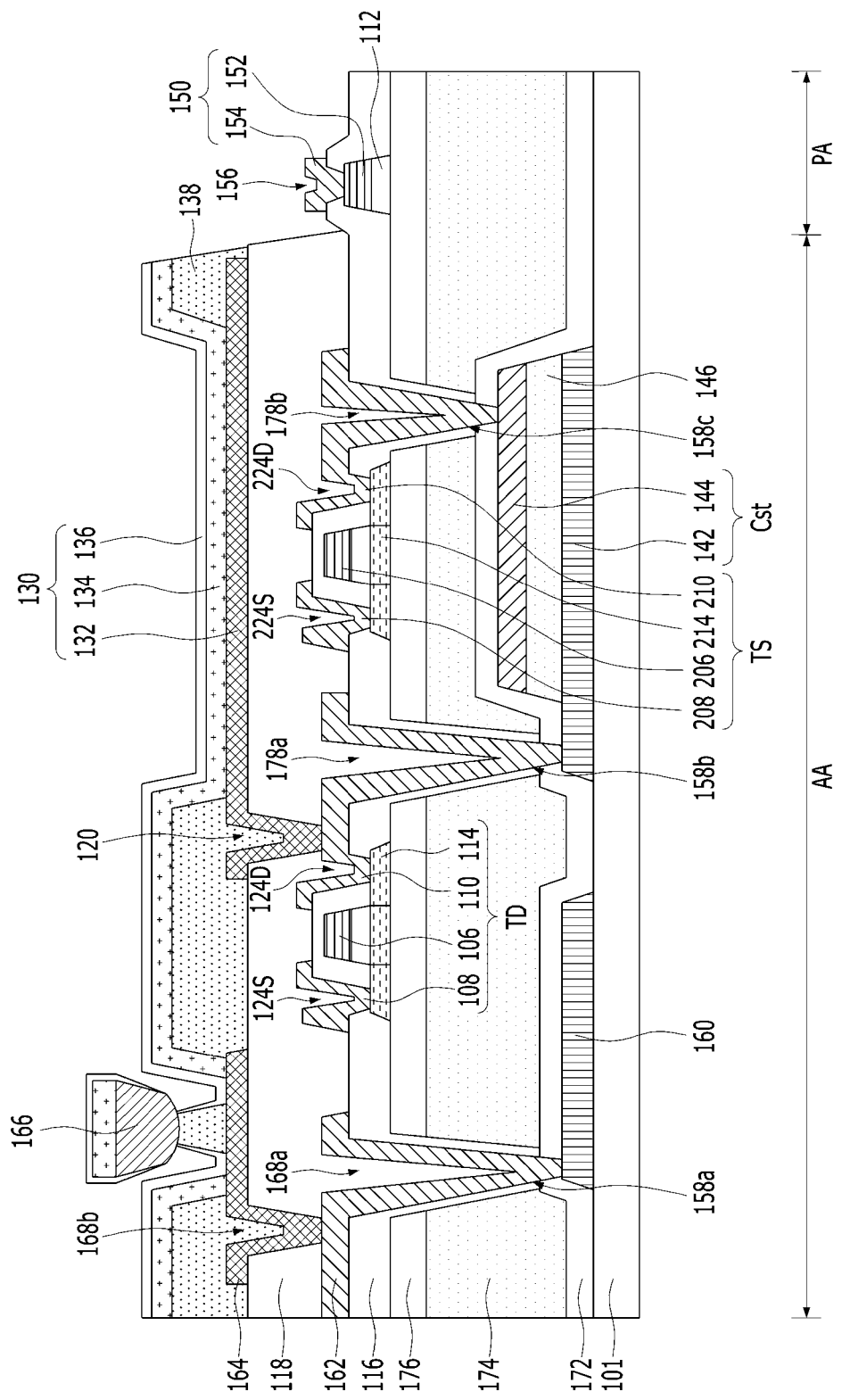

Referring to FIG. 5I, the partition 166, the light-emitting stack 134 and the cathode 136 are sequentially formed on the substrate 101, on which the bank 138 has been formed.

Specifically, a photosensitive film for the partition is coated on the substrate 101, on which the bank 138 has been formed, and is then patterned through a photolithography process, whereby an inversely-tapered-shaped partition 166 is formed. Subsequently, the organic light-emitting stack 134 and the cathode 136 using a sixth conductive layer are sequentially formed in the active area AA, excluding the pad area PA, through a deposition process using a shadow mask.

As such, according to the method of manufacturing the organic light-emitting display device of the present invention, the lower storage electrode 142, the storage buffer layer 146 and the upper storage electrode 144 are formed through the same mask process, and the first to third open holes 158a, 158b and 158c and the active layers 114 and 214 are formed through the same mask process. Accordingly, the present invention may obviate at least two mask processes, as compared to the prior art.

Although the pixel-driving circuit according to the present invention has been described above as including the switching and driving transistors TS and TD and the storage capacitor Cst, this structure of the pixel-driving circuit is merely illustrative, and the present invention is not limited thereto. In an example, the present invention may be applied to a structure in which the pixel-driving circuit further includes a sensing transistor. The sensing transistor serves to sense the threshold voltage of the driving transistor TD, and the data voltage is compensated in proportion to the sensed threshold voltage. Herein, because a reference line, which is connected to a source electrode of the sensing transistor, overlaps the data line DL in the vertical direction, with at least one buffer layer 170, including the organic buffer layer 174, interposed therebetween, it is possible to accomplish a high-resolution design.

Further, although the present invention has been described above with reference to the organic light-emitting display device, the present invention may also be applied to all kinds of display devices that include a storage capacitor and a transistor. In an example, a storage capacitor and a thin-film transistor of a liquid crystal display device may overlap each other in the vertical direction, with at least one buffer layer, including an organic buffer layer, interposed therebetween.

As is apparent from the above description, in an organic light-emitting display device according to the present invention, at least one of a switching transistor, a driving transistor and a data line and at least one of a storage capacitor, a low-voltage supply line and a high-voltage supply line overlap each other in the vertical direction, with at least one buffer layer, including an organic buffer layer, interposed therebetween. Accordingly, a capacitor area, in which the storage capacitor is disposed, overlaps an emission area and a transistor area in the vertical direction, and signal lines overlap each other in the vertical direction, thereby ensuring a sufficient process margin and consequently realizing a high resolution and improving production yield. Further, the top surface of an upper storage electrode of the storage capacitor is protected by a first inorganic buffer layer, and the top surface of a lower storage electrode is protected by a storage buffer layer, thereby preventing the upper storage electrode and the lower storage electrode from being oxidized due to the organic buffer layer. In addition, because the lower storage electrode, the storage buffer layer and the upper storage electrode are formed through the same mask process and first to third open holes and active layers are formed through the same mask process, it is possible to obviate at least two mask processes, as compared to the prior art.

It will be apparent to those skilled in the art that various modifications and variations can be made in the organic light-emitting display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light-emitting display device, comprising:
   a storage capacitor disposed on a substrate;
   at least one buffer layer disposed on the storage capacitor;
   at least one transistor overlapping the storage capacitor in plan view, with the at least one buffer layer interposed therebetween; and
   a light-emitting diode connected to the transistor,
   wherein the storage capacitor includes a lower storage electrode and an upper storage electrode overlapping the lower storage electrode, with a storage buffer layer interposed therebetween, and
   wherein one of the lower storage electrode and the upper storage electrode has a same line width and a same shape as the storage buffer layer.

2. The organic light-emitting display device according to claim 1, wherein a remaining one of the lower storage electrode and the upper storage electrode has a larger line width than the storage buffer layer.

3. The organic light-emitting display device according to claim 2, wherein the lower storage electrode is disposed on the substrate and has a larger line width than the storage buffer layer, and the upper storage electrode has a same line width and a same shape as the storage buffer layer.

4. The organic light-emitting display device according to claim 1, wherein the at least one buffer layer includes:
a first inorganic buffer layer disposed on the substrate;
an organic buffer layer disposed on the first inorganic buffer layer and formed of an organic insulation material; and
a second inorganic buffer layer disposed on the organic buffer layer to have a same shape as the organic buffer layer.

5. The organic light-emitting display device according to claim 4, wherein the storage buffer layer is formed of an inorganic insulation material.

6. The organic light-emitting display device according to claim 4, further comprising:
an open hole formed to penetrate the organic buffer layer and the second inorganic buffer layer to expose a top surface of the first inorganic buffer layer disposed on the upper storage electrode and the lower storage electrode; and
a storage contact hole formed to penetrate the first inorganic buffer layer and an interlayer insulation film to expose each of the upper storage electrode and the lower storage electrode.

7. The organic light-emitting display device according to claim 6, wherein the storage contact hole has a smaller line width than the open hole, and the interlayer insulation film is disposed to cover side surfaces of the organic buffer layer exposed by the open hole.

8. The organic light-emitting display device according to claim 6, wherein the storage contact hole has a same line width as the open hole.

9. The organic light-emitting display device according to claim 4, wherein the upper storage electrode is in contact at a top surface and side surfaces thereof with the first inorganic buffer layer, and the lower storage electrode is in contact at a top surface and side surfaces thereof with the first inorganic buffer layer and the storage buffer layer.

10. The organic light-emitting display device according to claim 4, further comprising:
a low-voltage supply line formed in a same plane as the lower storage electrode using a same material as the lower storage electrode; and
a high-voltage supply line and a data line arranged parallel to the low-voltage supply line,
wherein at least one of the low-voltage supply line and the high-voltage supply line overlaps the data line, with the at least one buffer layer interposed therebetween.

11. The organic light-emitting display device according to claim 10, wherein the low-voltage supply line is in contact at a top surface and side surfaces thereof with the first inorganic buffer layer.

12. The organic light-emitting display device according to claim 11, wherein the at least one transistor includes:
a driving transistor connected to the light-emitting diode; and a switching transistor connected to the driving transistor, and
wherein the switching transistor overlaps one of the low-voltage supply line and the storage capacitor, with the at least one buffer layer interposed therebetween, and
the driving transistor overlaps a remaining one of the low-voltage supply line and the storage capacitor, with the at least one buffer layer interposed therebetween.

13. The organic light-emitting display device according to claim 12, further comprising:
a reference line disposed on the substrate parallel to the data line; and
a sensing transistor connected to the reference line,
wherein the reference line overlaps the data line, with the at least one buffer layer interposed therebetween.

14. The organic light-emitting display device according to claim 12, wherein the lower storage electrode is connected to a drain electrode of one of the driving transistor and the switching transistor, and the upper storage electrode is connected to a drain electrode of a remaining one of the driving transistor and the switching transistor.

15. The organic light-emitting display device according to claim 1, further comprising:
a low-voltage supply line formed in a same plane as the lower storage electrode using a same material as the lower storage electrode; and
a high-voltage supply line and a data line arranged parallel to the low-voltage supply line,
wherein the data line overlaps at least one of the low-voltage supply line, the high-voltage supply line and the storage capacitor in a vertical direction, with the at least one buffer layer interposed therebetween.

16. The organic light-emitting display device according to claim 4, wherein the second inorganic buffer layer has a same line width as the organic buffer layer.

17. The organic light-emitting display device according to claim 1,
wherein the light-emitting diode comprises an anode, a cathode and at least one light-emitting stack therebetween,
wherein the display device further comprises an auxiliary connection electrode formed on the at least one buffer layer, a bank for exposing the anode and the auxiliary connection electrode, and a partition formed on the bank, which is disposed on the auxiliary connection electrode and has an inversely tapered shape,
wherein the light-emitting stack is separated from each other on the auxiliary connection electrode by the partition.

18. The organic light-emitting display device according to claim 17, wherein the light-emitting stack is formed only on a top surface of the anode exposed by the bank, a top surface of the partition, and a top surface and side surfaces of the bank.

19. An organic light-emitting display device, comprising:
a storage capacitor disposed on a substrate;
at least one buffer layer disposed on the storage capacitor;
at least one transistor overlapping the storage capacitor, with the at least one buffer layer interposed therebetween; and
a light-emitting diode connected to the transistor,
wherein the storage capacitor includes a lower storage electrode and an upper storage electrode overlapping the lower storage electrode, with a storage buffer layer interposed therebetween,
wherein one of the lower storage electrode and the upper storage electrode has a same line width and a same shape as the storage buffer layer, and
wherein the at least one buffer layer includes:
a first inorganic buffer layer disposed on the substrate;
an
organic buffer layer disposed on the first inorganic buffer layer and formed of an organic insulation material; and
a second inorganic buffer layer disposed on the organic buffer layer to have a same shape as the organic buffer layer.

20. An organic light-emitting display device, comprising:
a storage capacitor disposed on a substrate;

at least one buffer layer disposed on the storage capacitor;
at least one transistor overlapping the storage capacitor, with the at least one buffer layer interposed therebetween;
a light-emitting diode connected to the transistor,
wherein the storage capacitor includes a lower storage electrode and an upper storage electrode overlapping the lower storage electrode, with a storage buffer layer interposed therebetween, and
wherein one of the lower storage electrode and the upper storage electrode has a same line width and a same shape as the storage buffer layer;
a low-voltage supply line formed in a same plane as the lower storage electrode using a same material as the lower storage electrode; and
a high-voltage supply line and a data line arranged parallel to the low-voltage supply line,
wherein the data line overlaps at least one of the low-voltage supply line, the high-voltage supply line and the storage capacitor in a vertical direction, with the at least one buffer layer interposed therebetween.

\* \* \* \* \*